United States Patent

Yamoto et al.

[11] Patent Number: 6,090,657
[45] Date of Patent: Jul. 18, 2000

[54] METHOD OF MANUFACTURING CAPACITOR HAVING FERROELECTRIC FILM FOR NONVOLATILE MEMORY CELL

[75] Inventors: Hisayoshi Yamoto; Akihiko Ochiai, both of Kanagawa, Japan

[73] Assignee: Sony Corporation, Tokyo, Japan

[21] Appl. No.: 08/859,916

[22] Filed: May 21, 1997

Related U.S. Application Data

[62] Division of application No. 08/722,640, Sep. 27, 1996.

[30] Foreign Application Priority Data

Sep. 29, 1995 [JP] Japan .................. P07-276782

[51] Int. Cl.[7] .................................. H01L 21/8242
[52] U.S. Cl. .................................. 438/240; 438/3
[58] Field of Search ................ 438/3, 240, 241, 438/253, 396

[56] References Cited

U.S. PATENT DOCUMENTS

| | | | |
|---|---|---|---|
| 5,046,043 | 9/1991 | Miller et al. | 365/145 |
| 5,216,572 | 6/1993 | Larson et al. | 438/3 |
| 5,475,248 | 12/1995 | Takenaka | 257/295 |
| 5,554,559 | 9/1996 | Wolters et al. | 438/3 |
| 5,580,814 | 12/1996 | Larson | 438/3 |

*Primary Examiner*—Chandra Chaudhari
*Attorney, Agent, or Firm*—Hill & Simpson

[57] ABSTRACT

A capacitor in a ferroelectric nonvolatile memory (FERAM) comprising a lower electrode formed on a semiconductor substrate; a ferroelectric thin film formed on the lower electrode; an upper electrode formed on the ferroelectric thin film; a first protective layer consisting of one or more layers formed between the semiconductor substrate and the lower electrode, and composed of a material selected from those of Group IVa transition metal, Group Va transition metal, Group IVa transition metal nitride, Group Va transition metal nitride, silicon nitride, nickel and palladium; and a second protective layer consisting of one or more layers formed on the upper electrode, and composed of a material selected from those of Group IVa transition metal, Group Va transition metal, Group IVa transition metal nitride, Group Va transition metal nitride, nickel and palladium. Since the ferroelectric capacitor is enclosed with composite films of such materials, it becomes possible to prevent diffusion of hydrogen and intrusion of water content therein to consequently avert deterioration of the characteristics.

4 Claims, 13 Drawing Sheets

F I G. 7C
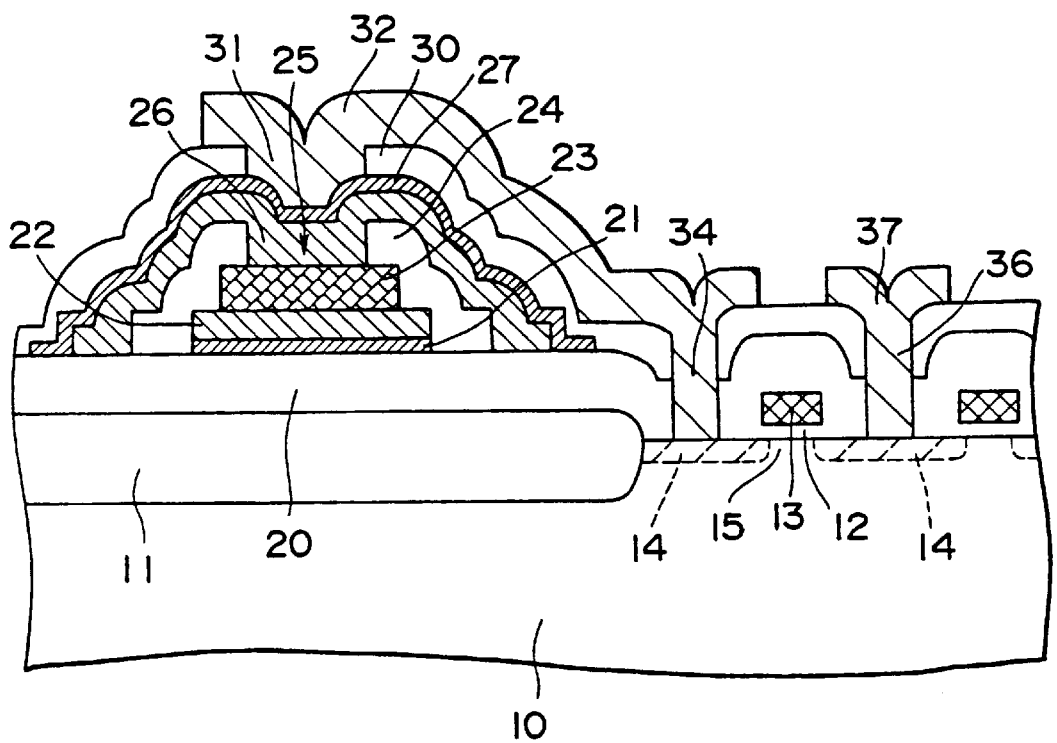

METHOD OF MANUFACTURING CAPACITOR HAVING FERROELECTRIC FILM FOR NONVOLATILE MEMORY CELL

This is a division, of application Ser. No. 08/722.640, filed Sep. 27, 1996 pending.

BACKGROUND OF THE INVENTION

The present invention relates to a nonvolatile memory cell having a capacitor formed by the use of a ferroelectric film, and also to a method of manufacturing the same.

With recent progress of the film forming technology, rapid studies are currently advanced in the application of nonvolatile memory cells each using a ferroelectric thin film. In the nonvolatile memory cell, it is possible to perform fast polarization inversion of a ferroelectric thin film and also fast rewriting effected by utilizing the residual polarization of the thin film. The nonvolatile memory cells with ferroelectric thin films being currently studied are broadly classified into a type to detect a change of a stored charge amount in a dielectric capacitor, and a type to detect a resistance change caused by spontaneous polarization of a ferroelectric. The semiconductor memory element related to the present invention belongs to the former type.

SUMMARY OF THE INVENTION

It is an object of the present invention to provide a semiconductor memory element of an improved construction so contrived as to suppress diffusion of hydrogen or intrusion of water content into a capacitor having a ferroelectric thin film, and also to provide a method of manufacturing such an improved memory element.

For the purpose of achieving the object mentioned above, the capacitor structure of the semiconductor memory element according to the present invention comprises: (a) a lower electrode formed on a semiconductor substrate; (b) a capacitor part composed of a ferroelectric thin film formed on the lower electrode; and (c) an upper electrode formed on the capacitor part. The capacitor structure further has: (d) a first protective layer consisting of one or more layers formed between the semiconductor substrate and the lower electrode, and composed of a material selected from those of Group IVa transition metal, Group Va transition metal, Group IVa transition metal nitride, Group Va transition metal nitride, silicon nitride, nickel and palladium; and (e) a second protective layer consisting of one or more layers formed on the upper electrode, and composed of a material selected from those of Group IVa transition metal, Group Va transition metal, Group IVa transition metal nitride, Group Va transition metal nitride, nickel and palladium.

In the capacitor structure of the semiconductor memory element of the present invention, it is preferred that the upper electrode covers the capacitor part, the lower electrode and the first protective layer via an insulator layer. In this case, it is further preferred that the second protective layer covers the surface of the upper electrode. Here, the expression of covering the surface of the upper electrode with the second protective layer does not signify that, when the upper electrode functions also as a wiring (e.g. plate line), the second protective layer covers even such wiring as well. This definition applies to the following description also.

A method of forming a capacitor structure of a semiconductor memory element according to a first aspect of the present invention for achieving the above object comprises the steps of: (a) forming, on a semiconductor substrate, a first protective layer consisting of one or more layers composed of a material selected from those of Group IVa transition metal, Group Va transition metal, Group IVa transition metal nitride, Group Va transition metal nitride, silicon nitride, nickel and palladium; (b) forming a lower electrode layer on the first protective layer; (c) forming a lower electrode by patterning the lower electrode layer and the first protective layer; (d) forming a ferroelectric thin film on the lower electrode, and patterning the ferroelectric thin film to thereby form a capacitor part composed of the ferroelectric thin film; (e) forming an insulator layer on the entire surface, and then forming an opening in the insulator layer at a position above the capacitor part; (f) forming an upper electrode layer on the insulator layer inclusive of the opening; (g) forming a second protective layer consisting of one or more layers formed on the upper electrode layer, and composed of a material selected from those of Group IVa transition metal, Group Va transition metal, Group IVa transition metal nitride, Group Va transition metal nitride, nickel and palladium; and (h) forming an upper electrode by patterning the second protective layer and the upper electrode layer.

A method of forming a capacitor structure of a semiconductor memory element according to a second aspect of the present invention for achieving the above object comprises the following steps instead of the steps (f), (g) and (h) defined in the method according to the second embodiment: (i) forming an upper electrode layer on the insulator layer inclusive of the opening, and then patterning the upper electrode layer to thereby form an upper electrode; and (j) forming, on the upper electrode, a second protective layer consisting of one or more layers and composed of a material selected from those of Group IVa transition metal, Group Va transition metal, Group IVa transition metal nitride, Group Va transition metal nitride, nickel and palladium, and then patterning the second protective layer in such a manner that the surface of the upper electrode is covered with the second protective layer.

A method of forming a capacitor structure of a semiconductor memory element according to a third aspect of the present invention for achieving the above object comprises the following steps instead of the steps (c) and (d) defined in the method according to the first embodiment: (k) forming a ferroelectric thin film on the lower electrode layer; and (l) patterning the ferroelectric thin film, the lower electrode layer and the first protective layer to thereby form a capacitor part composed of the ferroelectric thin film, and a lower electrode.

A method of forming a capacitor structure of a semiconductor memory element according to a fourth aspect of the present invention for achieving the above object comprises the steps of: (a) forming, on a semiconductor substrate, a first protective layer consisting of one or more layers composed of a material selected from those of Group IVa transition metal, Group Va transition metal, Group IVa transition metal nitride, Group Va transition metal nitride, silicon nitride, nickel and palladium; (b) forming a lower electrode layer on the first protective layer; (c) forming a ferroelectric thin film on the lower electrode layer; (d) patterning the ferroelectric thin film, the lower electrode layer and the first protective layer to thereby form a capacitor composed of said ferroelectric thin film, and a lower electrode; (e) forming an insulator layer on the entire surface, and then forming an opening in the insulator layer at a position above the capacitor part; (f) forming an upper electrode layer on the insulator layer inclusive of the opening, and then patterning the upper electrode layer to thereby form an upper electrode; and (g) forming, on the upper electrode, a second protective layer consisting of one or more layers and composed of a material selected from those of Group IVa transition metal, Group Va transition metal, Group IVa transition metal nitride, Group Va transition metal nitride, nickel and palladium, and then patterning the second protective layer in such a manner that the surface of the upper electrode is covered with the second protective layer.

In the present invention, an exemplary material for composing the lower electrode may be Pt, $RuO_2$, $IrO_2$, La—Sr—Co—O (LSCO) having a perovskite structure, or a two-layer structure of LSCO/Pt formed in this order from below. Meanwhile, an exemplary material for composing the upper electrode may be Pt, $RuO_2$, $IrO_2$ or aluminum alloy.

The ferroelectric thin film may be composed of a perovskite type ferroelectric material of a Bi-series layer structure. More specifically, an exemplary material suited for composing the ferroelectric thin film may be $Bi_2SrTa_2O_9$, $Bi_2SrNb_2O_9$, $Bi_2BaTa_2O_9$, $Bi_4SrTi_4O_{15}$, $Bi_4Ti_3O_{12}$, $Bi_2SrTa_xNb_{2-x}O_9$, or $Bi_2PbTa_2O_9$. Particularly it is preferred that the ferroelectric thin film be composed of a Y1-series material ($Bi_2$(Sr, Ba, Ca) (Ta, $Nb)_2O_9$). And it is further preferred that the Y1-series material be composed of $Bi_2SrTa_2O_9$. Other exemplary materials suited for composing the ferroelectric thin film are PZT and PLZT.

The first protective layer or the second protective layer may consist of a single layer of a material selected from those of Group IVa transition metal (Ti, Zr, Hf), Group Va transition metal (V, Nb, Ta), Group IVa transition metal nitride, Group Va transition metal nitride, silicon nitride, nickel and palladium. The first or second protective layer may consist of a two-layer structure which is composed of the following materials deposited in the shown order from below.

Group IVa transition metal/Group Va transition metal

Group IVa transition metal/Group IV transition metal nitride

Group IVa transition metal/Group Va transition metal nitride

Group Va transition metal/Group IVa transition metal

Group Va transition metal/Group IVa transition metal nitride

Group Va transition metal/Group Va transition metal nitride

Group IVa transition metal nitride/Group IVa transition metal

Group IVa transition metal nitride/Group Va transition metal

Group IVa transition metal nitride/Group Va transition metal nitride

Group Va transition metal nitride/Group IVa transition metal

Group Va transition metal nitride/Group IVa transition metal nitride

Group Va transition metal nitride/Group Va transition metal

Further, the first or second protective layer may consist of a three-layer structure composed of the following materials for example.

Group IVa transition metal/Group IVa transition metal nitride/Group IVa transition metal Group IVa transition metal/Group IVa transition metal nitride/Group Va transition metal Group IVa transition metal/Group Va transition metal nitride/Group IVa transition metal p1 Group IVa transition metal/Group Va transition metal nitride/Group Va transition metal Group Va transition metal/Group Va transition metal nitride/Group IVa transition metal Group Va transition metal/Group Va transition metal nitride/Group Va transition metal In the above examples of multilayer compositions, any transition metal or transition metal nitride may be replaced with silicon nitride, nickel or palladium.

The semiconductor substrate may be composed of any of known insulator materials such as $SiO_2$, BPSG, PSG, BSG, AsSG, PbSG, SbSG, SOG, SiON, SiN, NSG and LTO; or an intermediate insulator layer composed by laminating such insulator materials. The substrate may also be an element isolating region having a LOCOS structure or a trench structure.

Similarly, the insulator layer formed under the upper electrode may be composed of any of known insulator materials such as $SiO_2$, BPSG, PSG, BSG, AsSG, PbSG, SbSG, SOG, SiON, SiN, NSG and LTO; or an intermediate insulator layer composed by laminating such insulator materials.

The structure of the semiconductor memory element according to the present invention can be embodied in an example where one of the source-drain regions and the upper electrode of the selective transistor constituting the semiconductor memory element are connected electrically to each other via a contact plug and a wiring, while the lower electrode is connected to a plate line; or in another example where one of the source-drain regions and the lower electrode of the selective transistor are connected electrically to each other via a contact plug, while the upper electrode is connected to a plate line. The former example is generally termed a planar semiconductor memory element, and the latter example is generally termed a stacked semiconductor memory element. In the stacked semiconductor memory element where one of the source-drain regions and the lower electrode of the selective transistor are mutually connected via the first protective layer, it is desired that the electric conductivity of the first protective layer be less than 0.01 $\Omega$cm or so. In this case, therefore, using silicon nitride for the first protective layer is not considered to be adequate.

In the present invention, the capacitor structure of the semiconductor memory element is surrounded with the first and second protective layers. And Group IVa transition metal or Group Va transition metal has properties to occlude hydrogen. Meanwhile Group IVa transition metal nitride, Group Va transition metal nitride, silicon nitride, nickel or palladium has properties to effectively prevent diffusion of hydrogen. In this case, the first and second protective layers composed of such materials have a barrier effect against intrusion of water content. Therefore, the provision of the first and second protective layers realizes effective suppression of diffusion and intrusion of hydrogen or water content into the capacitor structure at the time of executing a hydrogen or heat treatment. As a result, there occurs no deterioration of the polarization characteristic of the capacitor structure, hence enhancing the long-term reliability of the semiconductor memory element. Moreover, when the substrate is composed principally of $SiO_2$, Group IVa transition metal or Group Va transition metal exerts a function of enhancing the adhesion between the lower electrode and the substrate.

The above and other features and advantages of the present invention will become apparent from the following description which will be given with reference to the illustrative accompanying drawings.

BRIEF DESCRIPTION OF THE DRAWINGS

FIGS. 7A to 7C are sectional views of a memory cell for explaining steps in manufacture of a semiconductor memory in Embodiment 2;

DETAILED DESCRIPTION OF THE PREFERRED EMBODIMENTS

Figure 1:
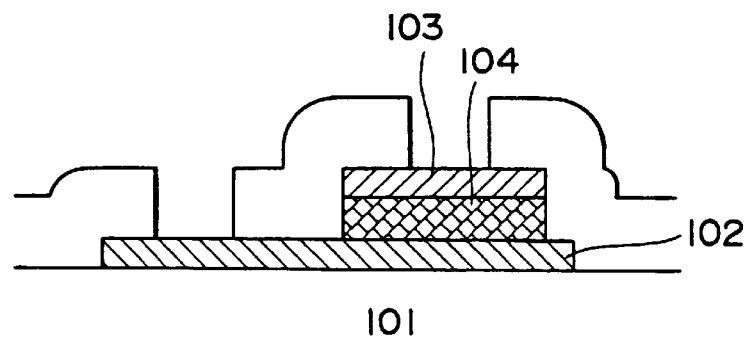
FIG. 1 is a typical partially sectional view of a ferroelectric capacitor.
Figure 2:
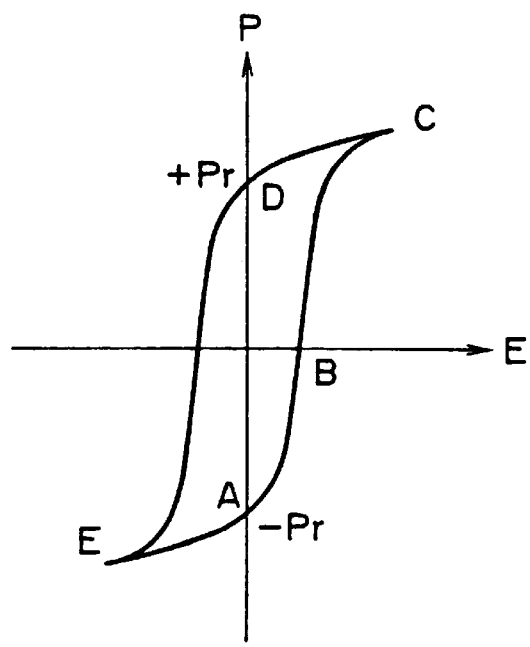
FIG. 2 graphically shows a hysteresis loop obtained in residual polarization of a ferroelectric by impression of an external electric field thereto.

As shown in a typical partially sectional view of FIG. 1, an exemplary ferroelectric capacitor, which is used in a nonvolatile memory cell having a structure of one capacitor plus one transistor (selective transistor) where a selective transistor is additionally connected to the ferroelectric capacitor, consists of an insulator layer 101, a lower electrode 102 and an upper electrode 103 formed thereon, and a ferroelectric thin film 104 interposed between such two electrodes. In a nonvolatile memory cell of this type, an operation of writing or reading data is performed by applying the P-E hysteresis loop of the ferroelectric shown graphically in FIG. 2. When an external electric field being impressed to the ferroelectric thin film is removed therefrom, the ferroelectric thin film represents spontaneous polarization. And the residual polarization of the ferroelectric thin film becomes +Pr in accordance with impression of a positive external electric field or becomes −Pr in accordance with impression of a negative external electric field. It is supposed here that "0" signifies one state +Pr (corresponding to D in FIG. 2) of the residual polarization, and "1" signifies the other state −Pr (corresponding to A in FIG. 2) of the residual polarization.

In order to discriminate between the states of "1" and "0", a positive external electric field for example is impressed to the ferroelectric thin film. Then the polarization of the ferroelectric thin film is turned to the state C in FIG. 2. In this case, if the data is "0", the polarization of the ferroelectric thin film is changed from D to C. Meanwhile, if the data is "1", the polarization of the ferroelectric thin film is changed from A via B to C. Thus, when the data is "0", there occurs none of polarization inversion in the ferroelectric thin film. However, when the data is "1", polarization inversion is caused in the ferroelectric thin film. As a result, a difference is produced in the stored charge amount in the ferroelectric capacitor. This stored charge is detected as a signal current by turning on the selective transistor of the selected memory cell. If the external electric field is reduced to zero after reading the data, the polarization of the ferroelectric thin film is turned to the state D in FIG. 2 regardless of whether the data is "0" or "1". Therefore, when the data is "1", a negative external field is impressed to turn the polarization to the state A via D and E, whereby the data "1" is written.

In a ferroelectric thin film composed of a perovskite ferroelectric material of Bi-series layer structure (hereinafter referred to as bismuth layer ferroelectric thin film in some cases), there is not observed a fatigue phenomenon (deterioration of the residual polarization caused by repeated rewriting of data) which is the worst defect in the known PZT-series ferroelectric thin film, so that it is currently attracting attention as a ferroelectric thin film suited for use in the aforementioned nonvolatile memory.

However, in the capacitor structure composed of such a bismuth layer ferroelectric thin film, there arises a problem of improper operation due to deterioration of the polarization characteristic (reduction of the residual polarization ±Pr) derived from the process of manufacturing the semiconductor memory element. The present inventors have found that the cause of the above problem resides in intrusion of hydrogen or water into the ferroelectric thin film. For example, in a bismuth layer ferroelectric thin film which is composed of a Y1-series material (such as $Bi_2SrTa_2O_9$) which is represented by $(Bi_2(Sr, Ba, Ca)(Ta, Nb)_2O_9)$, there essentially occurs almost no deterioration of the residual polarization ±Pr. Nevertheless, if hydrogen is diffused into such a Y1-series material, deterioration of the residual polarization ±Pr is practically induced. It has been found that, if the capacitor structure shown in FIG. 1 is treated with hydrogen under exemplary conditions of a 100% hydrogen atmosphere and a treatment temperature of 420° C., the value of Pr+|−Pr| is lowered approximately by 20% in comparison with the value prior to the hydrogen treatment.

In the process of manufacturing a semiconductor memory element, a hydrogen treatment is executed to eliminate a dangling bond which is existent, for example, in the interface between a silicon semiconductor substrate and a silicon oxide film. Therefore, in manufacture of any semiconductor memory element having a capacitor structure composed of a ferroelectric thin film, it is necessary to prevent impairment of the reliability of the ferroelectric thin film that may be caused by intrusion of hydrogen into the ferroelectric thin film. Meanwhile, it is also necessary on the other hand to diffuse hydrogen into the selective transistor of the semiconductor memory element. In the related art known heretofore, there is adopted a step of inhibiting diffusion of hydrogen into the capacitor structure inclusive of the selective transistor, by eliminating execution of a hydrogen treatment (e.g., in an atmosphere containing $H_2$ of 3 to 100% and at 400 to 450° C.) before or after forming a wiring of aluminum alloy or the like, or by not forming a hydrogen-containing thin film (e.g., SiHN film produced by plasma CVD, or SiHN film produced by optical CVD), or by forming a hydrogen-containing thin film at a low temperature of 200 to 350° C. and thereafter not executing a heat treatment at any higher temperature (e.g., 350 to 450° C.). According to the above step, however, the characteristic of the selective transistor is deteriorated. And when various heat treatments are executed during the process of manufacturing the semiconductor memory element, the water content left in the insulator layer and so forth intrudes into the capacitor structure to consequently induce a phenomenon of lowering the residual polarization ±Pr.

Figure 3:
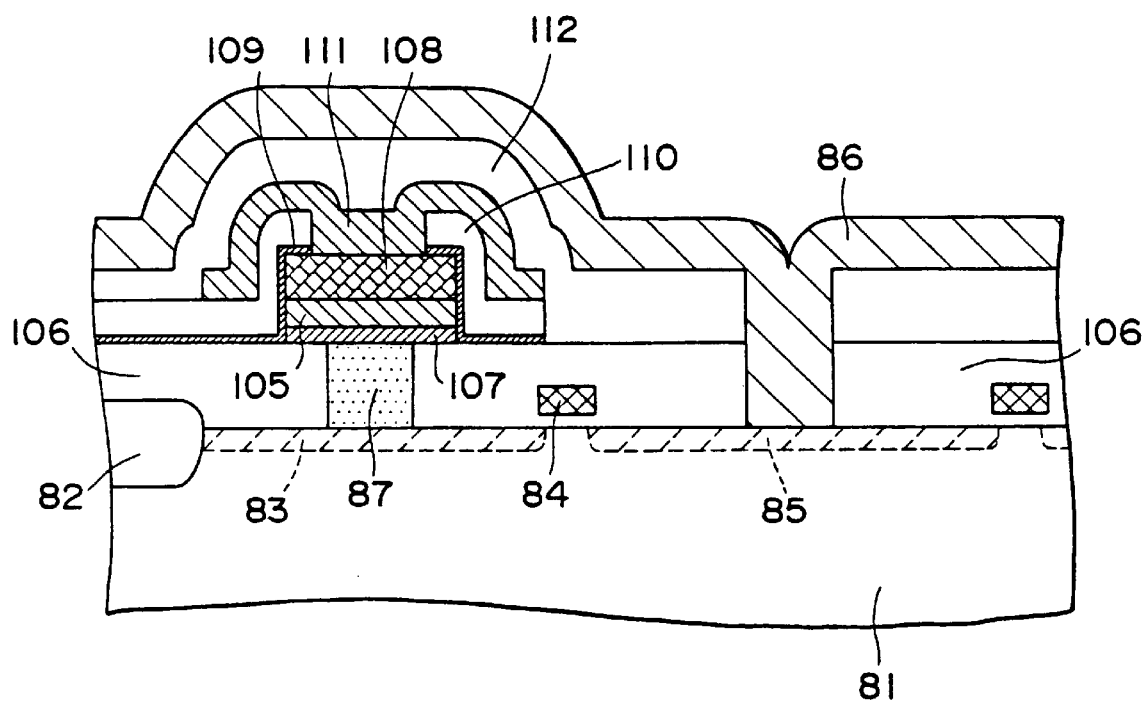
FIG. 3 is a typical sectional view of a nonvolatile memory cell using a ferroelectric capacitor.

As a semiconductor memory element contrived for the purpose of preventing diffusion of oxygen, there is known an example having such a structure as shown in a typical partially sectional view of FIG. 3 and disclosed in a cited reference: "A Half-Micron Ferroelectric Memory Cell Technology with Stacked Capacitor Structure", S. Onishi, et al., IEDM94 pp. 843–846. In this semiconductor memory element, a source region 83, a gate electrode 84 and a drain region 85 are formed in areas of a semiconductor substrate 81 divided by an element isolating region 82, and a bit line 86 is connected to the drain region 85 via a contact opening formed in an upper intermediate insulator layer 112 and a lower intermediate insulator layer 106. The source region 83 is connected to a ground layer 107 via a contact plug 87, and the ground layer 107, which is composed of a Ti layer and a TiN layer formed in this order from below, is provided between a lower electrode 105 of platinum (Pt) and the lower intermediate insulator layer 106. The ground layer 107 composed of such Ti layer and TiN layer is provided in an attempt to prevent diffusion into the lower electrode 105 of platinum and also to enhance the adhesion to the lower intermediate insulator layer 106. The lower electrode 105 and a ferroelectric thin film 108 are formed on the ground layer 107. And further a $TiO_2$ layer 109 is formed on the lower intermediate insulator layer 106, on the side faces of the ferroelectric thin film 108, the lower electrode 105 and the ground layer 107, and also on a portion of the top of the ferroelectric thin film 108, in such a manner as to cover the ferroelectric thin film 108, the lower electrode 105 and the ground layer 107. This $TiO_2$ layer 109 is provided for preventing diffusion of oxygen. An insulator layer 110 is formed on the $TiO_2$ layer 109, and an opening is formed in the $TiO_2$ layer 109 and the insulator layer 110 above the ferroelectric thin film 108, and further an upper electrode 111 is formed on the insulator layer inclusive of such an opening. The technology disclosed in this cited reference is concerned with prevention of diffusion of oxygen into the capacitor structure, but is not concerned with prevention of diffusion of hydrogen into the capacitor structure, particularly into the ferroelectric thin film 108. Moreover, the $TiO_2$ layer 109 is not capable of effectively preventing diffusion of hydrogen, since the $TiO_2$ layer 109 covers merely the side face of the capacitor and a portion of its top, and it is considered impossible to prevent diffusion of hydrogen via the upper platinum electrode 111 which is not covered completely with the $TiO_2$ layer 109. And it is presumed that the effect attainable by the use of $TiO_2$ for preventing diffusion of hydrogen is inferior to the effect attained by the use of Ti or TiN.

(Embodiment 1)

Embodiment 1 relates to a capacitor structure of a semiconductor memory element in the present invention, and also to a method of forming the capacitor structure of the semiconductor memory element according to the first aspect of the invention. A ferroelectric thin film is composed of a Y1-series material of $Bi_2SrTa_2O_9$, and each of a first protective layer 21 and a second protective layer 27 has a two-layer structure which consists of a layer of Group IVa transition metal and another layer of Group IVa transition metal nitride. More specifically, each of the first protective layer 21 and the second protective layer 27 has a two-layer structure consisting of a Ti layer and a TiN layer in this order from below. The semiconductor memory element consists of the aforementioned nonvolatile memory cell (known as FERAM). In the semiconductor memory cell represented by Embodiment 1, one of source-drain regions 14 and an upper electrode 26 of a selective transistor are connected electrically to each other via a contact plug 34 and a wiring 32, while a lower electrode 22 is connected to a plate line. And this element has a construction of so-called planar semiconductor memory element where the capacitor structure is not formed above the selective transistor 38. Now, Embodiment 1 will be described below with reference to FIGS. 4, 5 and 6A–6F.

Figure 4:
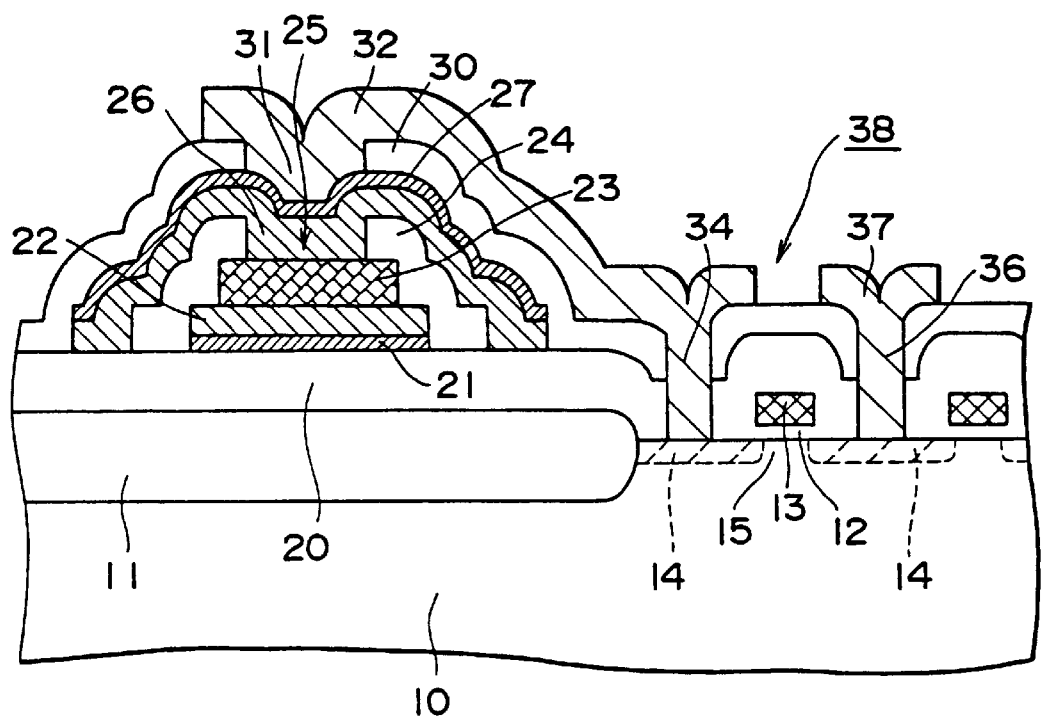
FIG. 4 is a typical partially sectional view of a nonvolatile memory cell using a ferroelectric capacitor according to Embodiment 1.
Figure 5:
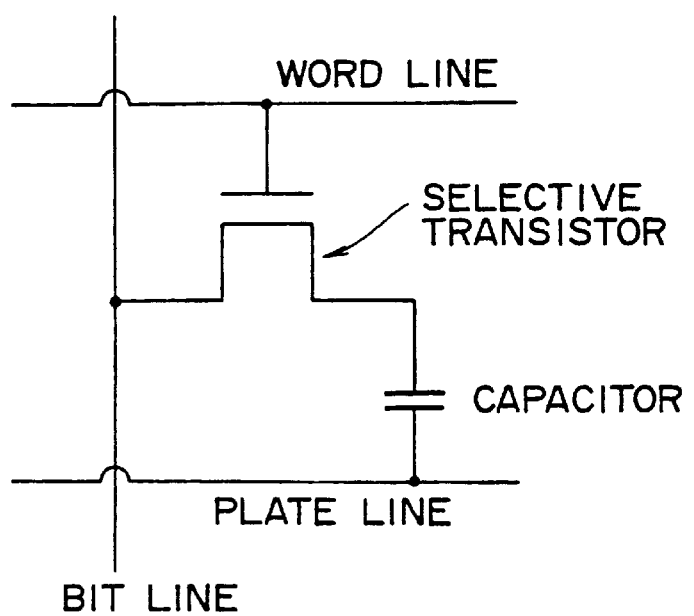
FIG. 5 is an equivalent circuit diagram of the nonvolatile memory cell shown in FIG. 4.

FIG. 4 is a typical partially sectional view showing the semiconductor memory element of Embodiment 1. And an equivalent circuit of the semiconductor memory element is shown in FIG. 5. The selective transistor constituting the semiconductor memory element consists of source-drain regions 14 and a channel region 15 formed on a silicon semiconductor substrate 10, a gate electrode 13 formed above the channel region 15, an element isolating region 11 having a LOCOS structure, and a gate oxide film 12 formed under the gate electrode 13. The gate electrode 13 serves also as a word line and is composed of, e.g., polysilicon, polycide or metal silicide. The source-drain regions 14 and the gate electrode 13 are covered with an intermediate insulator layer 20. This intermediate insulator layer 20 corresponds to a substrate and is composed of BPSG for example.

A capacitor structure is formed on the intermediate insulator layer 20 on the element isolating region 11. The capacitor structure consists of a lower electrode 22 of platinum (Pt), a ferroelectric thin film 23, and an upper electrode 26 of platinum. The lower electrode 22 is formed on the intermediate insulator layer 20 corresponding to a substrate. The ferroelectric thin film 23 is formed on the lower electrode 22. And the upper electrode 26 is formed on the ferroelectric thin film 23 via an opening 25.

A first protective layer 21 is formed between the intermediate insulator layer 20 corresponding to a substrate and the lower electrode 22. Meanwhile a second protective layer 27 is formed on the upper electrode 26. In Embodiment 1, each of the first protective layer 21 and the second protective layer 27 has a two-layer structure consisting of a layer of Group IVa transition metal (concretely Ti) and a layer of Group IVa transition metal nitride (concretely TiN). In this structure, the layer composed of Ti is a lower one, while the layer composed of TiN is an upper one. In FIG. 4, the first protective layer 21 and the second protective layer 27 are illustrated as a single layer. In Embodiment 1, the upper electrode 26 covers the ferroelectric thin film 23, the lower electrode 22 and the first protective layer 21 via an insulator layer 24 composed of $SiO_2$ for example.

An upper insulator layer 30 composed of BPSG for example is formed on the second protective layer 27. The upper electrode 26 is connected via the second protective layer 27 to a wiring 32 which extends in an opening 31 formed in the upper insulator layer 30. Further the wiring 32 is connected to one of the source-drain regions 14 (e.g., source region) of the selective transistor via a contact plug 34 provided in the upper insulator layer 30 and the intermediate insulator layer 20. Meanwhile the other of the source-drain regions 14 (e.g., drain region) of the selective transistor is connected to a bit line 37 via a contact plug 36 provided in the upper insulator layer 30 and the intermediate insulator layer 20. The lower electrode 22 is connected to a plate line, but such connection is omitted in the illustration.

Now a method of manufacturing a planar semiconductor memory element in Embodiment 1 will be described below with reference to FIGS. 6A to 6F which are typical partially sectional views of a semiconductor substrate and so forth.

[Step 1]

First, an element isolating region 11 having a LOCOS structure is formed on a silicon semiconductor substrate 10 by a known method. Subsequently the surface of the semiconductor substrate 10 is oxidized to form a gate oxide film 12. Then a polysilicon layer is deposited on the entire surface by a process of CVD for example, and thereafter the polysilicon layer is patterned by photolithography and etching to form a gate electrode 13 composed of polysilicon. This gate electrode 13 serves also as a word line. Next, impurity ions are implanted and then the implanted impurity is activated to thereby form source-drain regions 14 and a channel region 15. Thus, a selective transistor in the semiconductor memory element is formed.

The element isolating region 11 having a LOCOS structure may be replaced with one having a trench structure. And the gate electrode 13 composed of a polysilicon layer may be replaced with one composed of polycide or metal silicide.

[Step 2]

Subsequently an intermediate insulator layer 20 corresponding to a substrate is formed on the semiconductor substrate 10 by a process of CVD for example. In this manner, there is produced the structure shown in FIG. 6A. It is preferred that, after the intermediate insulator layer 20 composed of BPSG is formed, this layer 20 be caused to reflow for a time of, e.g., 20 minutes at 900° C. in an atmosphere of nitrogen gas. It is further preferred that, when necessary, the top surface of the intermediate insulator layer 20 be polished and flattened chemically and mechanically by a process of chemical mechanical polishing (CMP), or be flattened by a process of resist etch back. The exemplary film forming conditions relative to the intermediate insulator layer 20 are as follows.

| | |
|---|---|
| Gas used: | $SiH_4/PH_3/B_2H_6$ |
| Film forming temperature: | 400° C. |
| Reaction pressure: | Atmospheric pressure |

[Step 3]

Thereafter a first protective layer 21 is formed on the intermediate insulator layer 20 corresponding to a substrate. In Embodiment 1, the first protective layer 21 has a two-layer structure consisting of a Ti layer and a TiN layer in this order from below. The Ti layer and the TiN layer are obtained by sputtering under the film forming conditions given below. The first protective layer 21 has a function of preventing diffusion of hydrogen and intrusion of water content into a capacitor structure which will be formed later. Further, the Ti layer has also a function of enhancing the adhesion between the substrate and a lower electrode which will be formed next.

| | |
|---|---|
| Ti layer (Thickness: 20 nm) | |
| Process gas: | Ar = 35 sccm |
| Pressure: | 0.20 Pa (1.5 mTorr) |
| DC power: | 400 W |
| Film forming temperature: | Room temperature |
| TiN layer (Thickness: 100 nm) | |
| Process gas: | $N_2$/Ar = 100/35 sccm |
| Pressure: | 0.40 Pa (3.0 mTorr) |
| DC power: | 900 W |
| Film forming temperature: | Room temperature |

[Step 4]

Subsequently a lower electrode layer is formed on the first protective layer 21. More specifically, a lower electrode layer composed of platinum (Pt) is deposited by DC sputtering on the entire surface inclusive of the top of the first protective layer 21. The thickness of the lower electrode layer is set to 0.1–0.2 μm. Exemplary DC sputtering conditions are as follows.

| | |
|---|---|
| DC power: | 200 W |
| Process gas: | Ar = 40 sccm |
| Pressure: | 0.20 Pa (1.5 mTorr) |
| Film forming temperature: | Room temperature |
| Deposition rate: | 10 mm/minute |

It is also possible to adopt a process of pulse laser deposition for forming the lower electrode layer of platinum (Pt). Exemplary platinum-film forming conditions by pulse laser deposition are as follows.

| Film forming conditions by pulse laser deposition: | |
|---|---|
| Target: | Pt |
| Laser used: | KrF excimer laser (Wavelength 248 nm, Pulse width 25 nsec, 5 Hz, 1.1 $J/cm^2$) |
| Film forming temperature: | 500–600° C. |

The lower electrode layer can also be composed of LSCO and Pt in this order from below. Exemplary LSCO-film forming conditions by a process of pulse laser ablation are as follows.

| | |
|---|---|
| Target: | LSCO |
| Laser used: | KrF excimer laser (Wavelength 248 nm, Pulse width 25 nsec, 3 Hz) |
| Output energy: | 400 mJ (1.1 $J/cm^2$) |
| Film forming temperature: | 550–600° C. |
| Oxygen partial pressure: | 40–120 Pa |

[step 5]

Thereafter the lower electrode layer and the first protective layer are patterned by the art of ion milling for example to form a lower electrode 22 from the lower electrode layer. Thus, the structure shown typically in FIG. 6B can be obtained. Although the lower electrode 22 serves also as a plate line, this state is omitted in the illustration.

[Step 6]

Figure 6A:
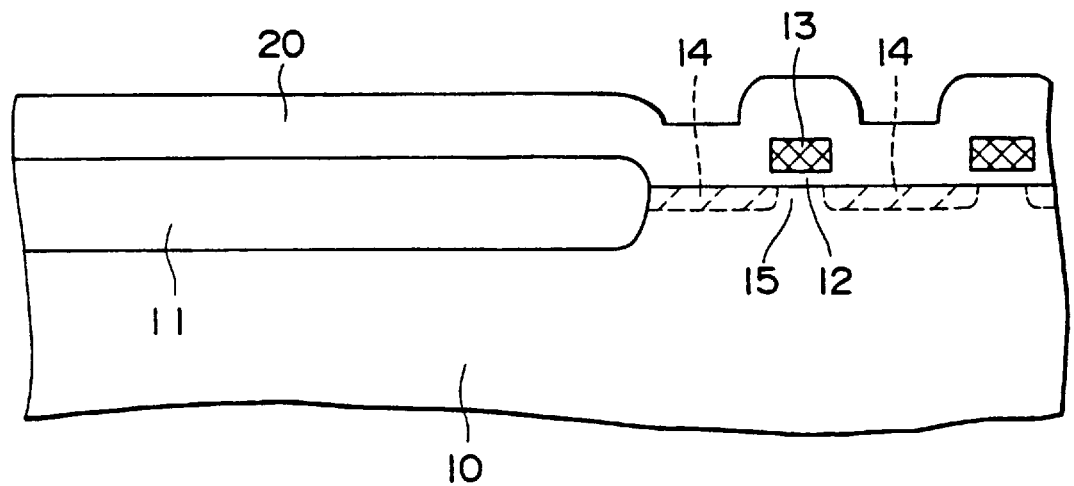
FIGS. 6A to 6F are sectional views of a memory cell for explaining steps in manufacture of a semiconductor memory in Embodiment 1.
Figure 6B:
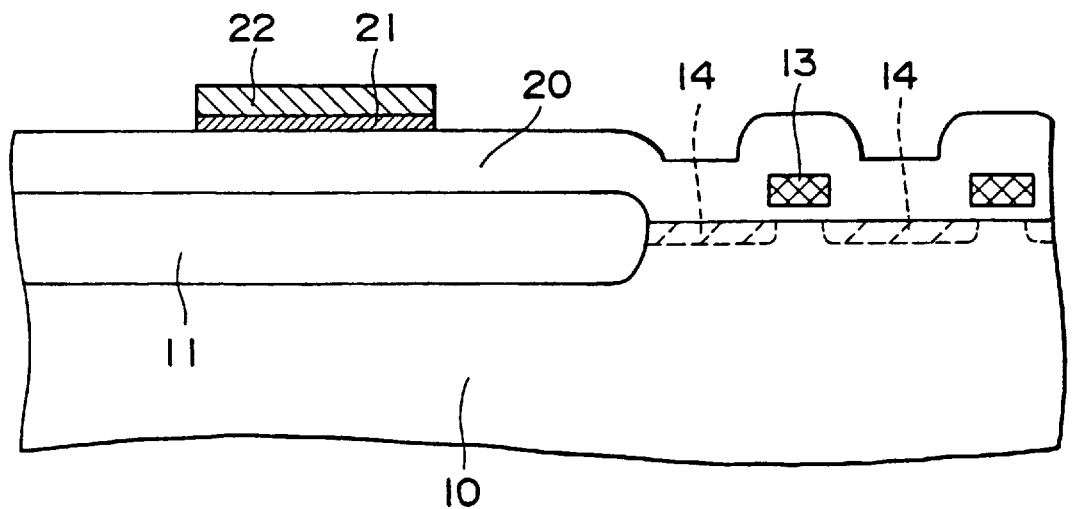
Figure 6C:
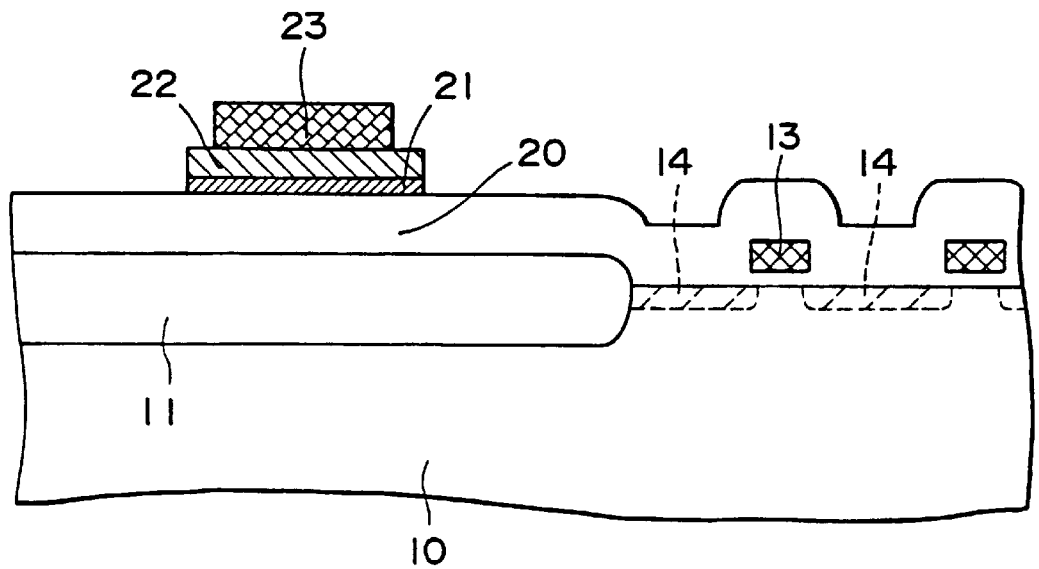
Figure 6D:
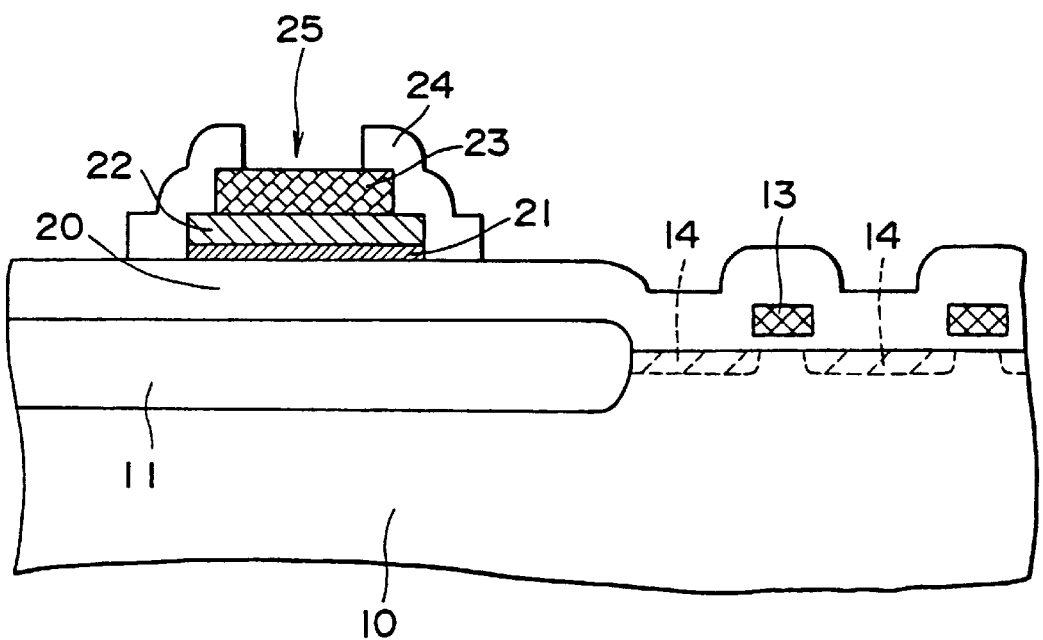

Next a ferroelectric thin film is formed on the lower electrode 22, and then the ferroelectric thin film is patterned to thereby form a capacitor part 23 which is composed of the ferroelectric thin film (FIG. 6C). More specifically, a ferroelectric thin film composed of a perovskite ferroelectric material of a Bi-series layer structure is first formed on the entire surface by a process of MOCVD. Exemplary film forming conditions relative to a Y1-series material of $Bi_2SrTa_2O_9$ are as follows.

| | |
|---|---|
| Source material: | $Bi(C_6H_5)_3$ |
| | $Sr(C_{11}H_{19}O_2)_2$ |
| | $Ta(OC_2H_5)_5$ |
| Film forming temperature: | 550–750° C. |
| Film forming pressure: | $1.3 \times 10$–$1.3 \times 10^3$ Pa (0.1–1 Torr) |
| Oxygen density: | 50% |

The ferroelectric thin film may be composed of $Bi_2SrTa_2O_9$ and formed by a process of pulse laser ablation. Exemplary film forming conditions for producing a ferroelectric thin film of $Bi_2SrTa_2O_9$ are given below. It is desired that the film of $Bi_2SrTa_2O_9$ formed under such conditions be treated by post-baking in an oxygen atmosphere for one hour at 800° C.

| Target: | $Bi_2SrTa_2O_9$ |
|---|---|
| Laser used: | KrF excimer laser (Wavelength 248 nm, Pulse width 25 nsec, 5 Hz) |
| Film forming temperature: | 500° C. |
| Oxygen partial pressure: | 3 Pa |

Further the ferroelectric thin film may be composed of PZT and formed by a process of magnetron sputtering. Exemplary film forming conditions are given below. If the target is replaced with PLZT, it becomes possible to form a ferroelectric thin film of PLZT on the entire surface.

| Target: | PZT |
|---|---|
| Process gas: | $Ar/O_2$ = 90% by volume/10% by volume |
| Pressure: | 4 Pa |
| Power: | 50 W |
| Film forming temperature: | 500° C. |
| Thickness of ferroelectric thin film: | 0.1–0.3 μm |

It is also possible to form a ferroelectric thin film of PZT or PLZT by a process of pulse laser ablation. Exemplary film forming conditions in this case are as follows.

| Target: | PZT or PLZT |
|---|---|
| Laser used: | KrF excimer laser (Wavelength 248 nm, Pulse width 25 nsec, 3 Hz) |
| Output energy: | 400 mJ (1.1 $J/cm^2$) |
| Film forming temperature: | 550–600° C. |
| Oxygen partial pressure: | 40–120 Pa |

Figure 6E:
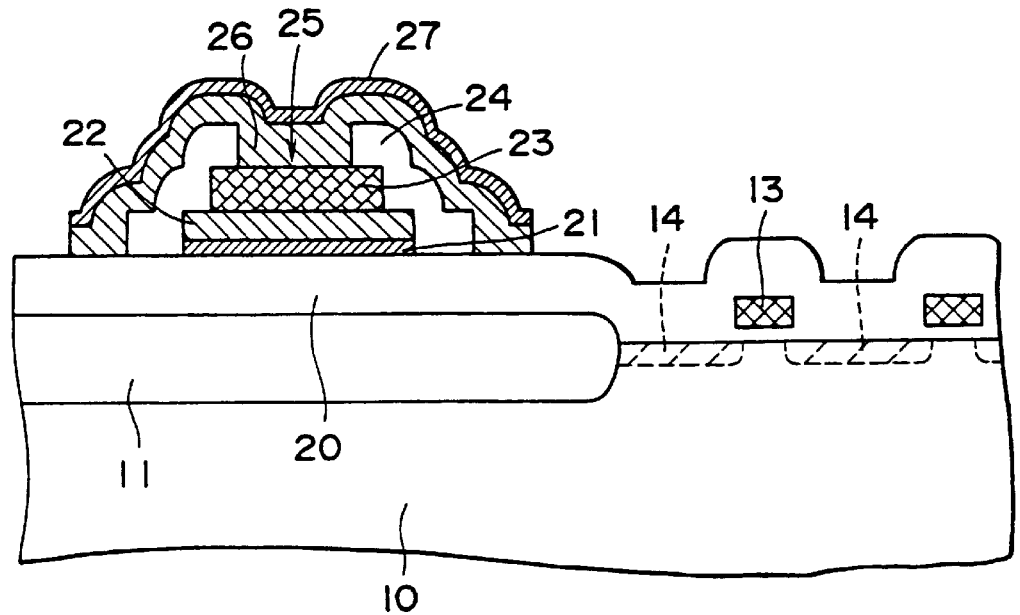
Figure 6F:
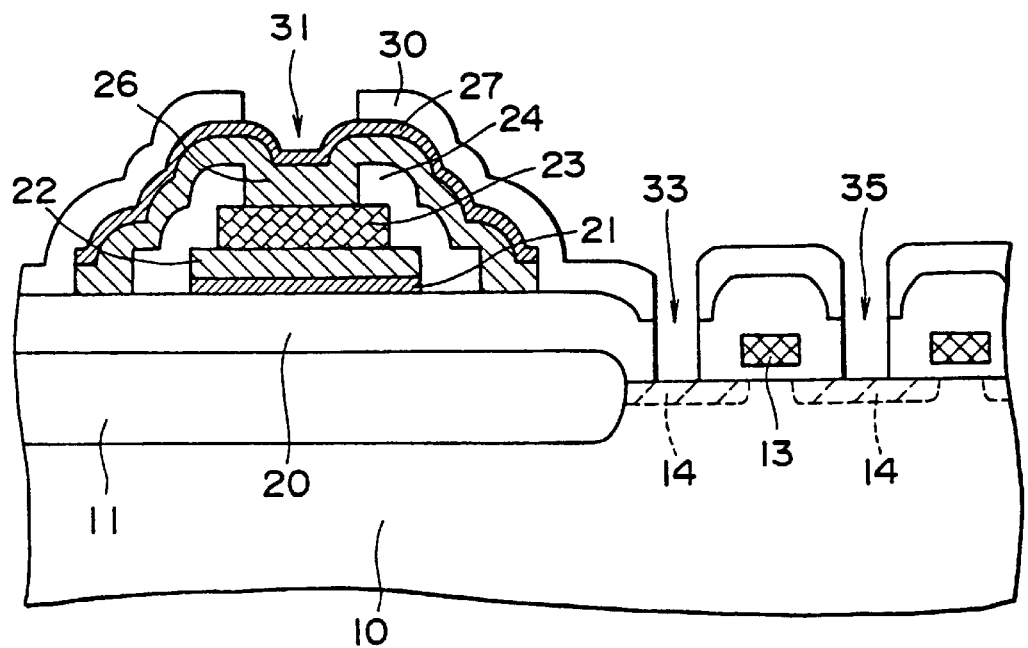

Subsequently the ferroelectric thin film layer is patterned by a process of RIE to form a ferroelectric thin film 23 composed of such layer.
[Step 7]
Next an insulator layer 24 composed of, e.g., $SiO_2$ is formed on the entire surface by CVD for example, and then an opening 25 is formed in the insulator layer 24 on the ferroelectric thin film 23 by RIE (FIG. 6D).
[Step 8]
Thereafter an upper electrode layer is formed on the insulator layer 24 inclusive of the opening 25. The upper electrode layer of platinum for example can be formed in the same manner as in [Step 4].
[Step 9]
Next a second protective layer 27 having a two-layer structure is formed on the upper electrode layer. In Embodiment 1, the two-layer structure of the second protective layer 27 consists of a Ti layer and a TiN layer in this order from below. The film forming conditions relative to the Ti layer and the TiN layer obtained by a process of sputtering may be the same as those in [Step 3]. Such second protective layer 27 has a function of preventing diffusion of hydrogen and intrusion of water content into the capacitor structure.
[Step 10]
Subsequently the second protective layer 27 and the upper electrode layer are patterned by an art of ion milling for example to form an upper electrode 26 (FIG. 6E). Thus, there is obtained a structure where the upper electrode 26 covers the ferroelectric thin film 23, the lower electrode 22 and the first protective layer 21 via the insulator layer 24. In Embodiment 1, the side wall of the upper electrode 26 is not covered with the second protective layer 27 since the second protective layer 27 and the upper electrode layer are patterned simultaneously. However, even in this structure, there arises no problem in preventing diffusion of hydrogen and intrusion of water content into the ferroelectric thin film 23.
[step 11]
Then an upper insulator layer 30 composed of BPSG for example is formed on the entire surface. The upper insulator layer 30 may be formed in the same manner as in [Step 2]. Subsequently an opening 31 is formed in the upper insulator layer 30 above the second protective layer 27, and openings 33 and 35 are formed by RIE in the upper insulator layer 30 and the intermediate insulator layer 20 above the source-drain regions 14 of the selective transistor. Next, in the same manner as in [Step 3], a Ti layer and a TiN layer (not shown) are formed by sputtering in this order from below on the upper insulator layer 30 inclusive of the openings 31, 33 and 35. Differing from the first and second protective layers 21 and 27, the purposes of these Ti and TiN layers do not reside in preventing diffusion of hydrogen or intrusion of water content into the capacitor part 23. The TiN layer is provided for preventing damage of the silicon semiconductor substrate 10 that may otherwise be caused by alloy spike on the silicon semiconductor substrate 10 at the bottoms of the openings 33 and 35 due to a wiring material layer of aluminum alloy to be formed next, and further for enhancing the wettability of the wiring material layer of aluminum alloy. Meanwhile the Ti layer is provided for obtaining an ohmic low contact resistance between the wiring material layer and the source-drain regions 14 at the bottoms of the openings 33 and 35.

Thereafter a wiring material layer is formed by a process of high temperature aluminum sputtering, so that the openings 31, 33 and 35 are filled with aluminum alloy to thereby form contact plugs 34 and 36. Exemplary film forming conditions relative to the wiring material layer of aluminum alloy are as follows. Wiring material layer of aluminum alloy (Al—Cu)

| Process gas: | Ar = 100 sccm |
|---|---|
| Pressure: | 0.26 Pa |
| RF power: | 15 kW |
| Substrate heating temperature: | 475° C. |

The high temperature aluminum sputtering adopted for forming a film of the wiring material layer of aluminum alloy may be replaced with another process of high temperature reflow or high pressure reflow as well. In the high temperature reflow, a wiring material layer of aluminum alloy is deposited on the upper insulator layer 30 under the following exemplary conditions.

| Process gas: | Ar = 100 sccm |
|---|---|
| DC power: | 20 kW |
| Sputtering pressure: | 0.4 Pa |
| Substrate heating temperature: | 150° C. |

Subsequently the semiconductor substrate 10 is heated up to 500° C. or so. Then the wiring material layer of aluminum alloy deposited on the upper insulator layer 30 is rendered fluidal to be thereby caused to flow into the openings 31, 33 and 35, which are thus filled certainly with the aluminum alloy to produce contact plugs 34 and 36. Meanwhile the wiring material layer of aluminum alloy is left on the upper insulator layer 30. Exemplary heating conditions are as follows.

| Heating method: | Heating reverse side of substrate with gas |
|---|---|
| Heating temperature: | 500° C. |
| Heating time: | 2 minutes |
| Process gas: | Ar = 100 sccm |
| Process gas pressure: | 1.1 × 10³ Pa |

The above heating is executed by first heating a heater block, which is disposed on the reverse side of the semiconductor substrate 10, up to a predetermined temperature (heating temperature), and then introducing a process gas into a space between the heater block and the semiconductor substrate 10 to thereby heat the semiconductor substrate 10. This heating method may be replaced with a lamp heating method or the like.

A process of high pressure reflow may be adopted instead of the high temperature reflow mentioned above. In this case, a reflow is executed under the following exemplary conditions.

| Substrate heating temperature: | 400° C. |
|---|---|
| Heating time: | 2 minutes |
| Heating atmosphere: | Argon gas |
| Atmosphere pressure: | Over 10⁶ Pa |

Finally a wiring 32 and a bit line 37 are formed by patterning the wiring material layer of aluminum alloy, the TiN layer and the Ti layer on the upper insulator layer (FIG. 4).

(Embodiment 2)

Embodiment 2 relates to a method of forming the capacitor structure of the semiconductor memory element according to the second aspect of the present invention. More specifically, Embodiment 2 is different from Embodiment 1 in the procedure for forming an upper electrode and a second protective layer. Hereinafter the method of forming the capacitor structure of the semiconductor memory element in Embodiment 2 will be described with reference to FIGS. 7A–7C.

[Step 21]

The following steps are the same as [Step 1] to [Step 7] in Embodiment 1: i.e., the step of forming a first protective layer 21, which consists of a Ti layer and a TiN layer, on an intermediate insulator layer 20 corresponding to a substrate; the step of forming a lower electrode layer on the first protective layer 21; the step of forming a lower electrode 22 by patterning the lower electrode layer and the first protective layer 21; the step of first forming a ferroelectric thin film 23 on the lower electrode 22 and then patterning the ferroelectric thin film 23; and the step of forming an insulator layer 24 on the entire surface and then forming an opening 25 in the insulator layer 24 on the ferroelectric thin film 23. Therefore a detailed explanation on the above steps is omitted here. The structure shown in FIG. 6D can thus be obtained.

[Step 22]

Figure 7A:
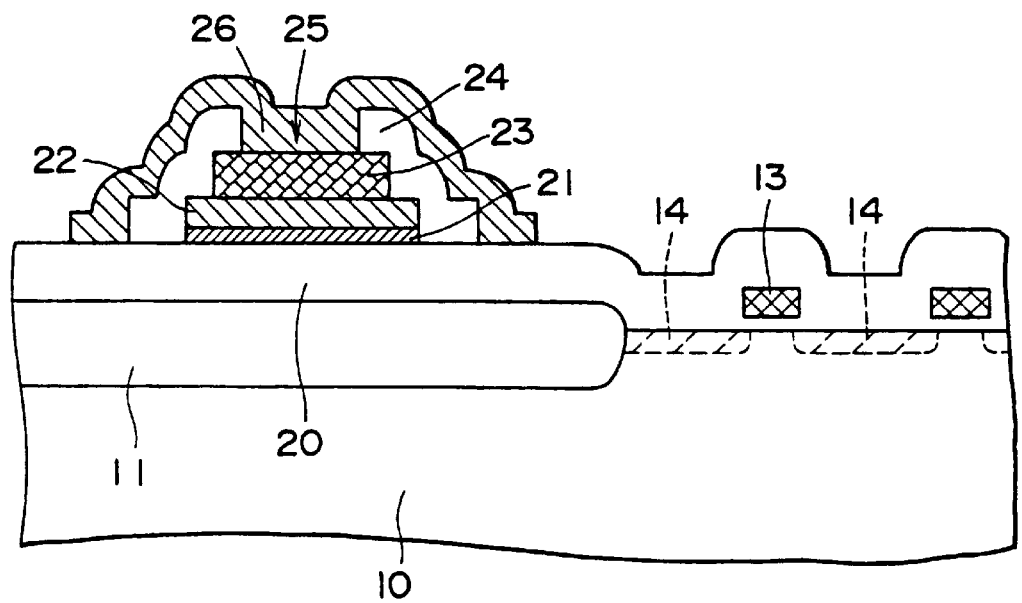

Subsequently an upper electrode layer is formed on the insulator layer 24 inclusive of the opening 25, and then an upper electrode 26 is formed by patterning the upper electrode layer (FIG. 7A). Forming the upper electrode layer can be executed in the same manner as in [Step 4]. And patterning the upper electrode layer can be performed by an art of ion milling for example.

[Step 23]

Figure 7B:
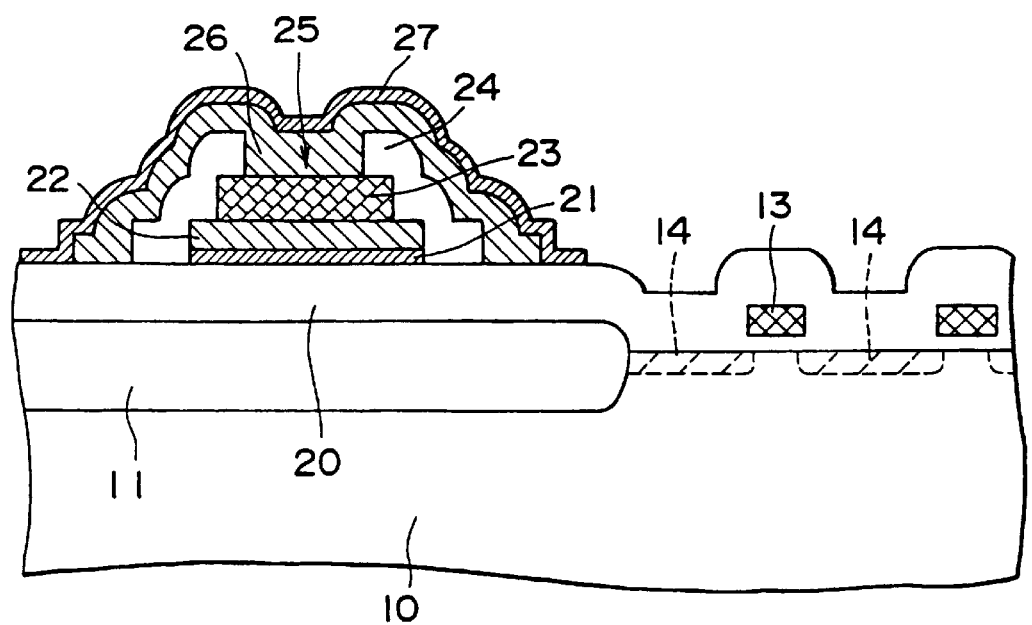

Thereafter a second protective layer 27 consisting of a single layer of Group IVa transition metal nitride (TiN in Embodiment 2) is formed on the upper electrode 26, and then the second protective layer 27 is so patterned as to cover the surface of the upper electrode 26 (FIG. 7B). The film forming conditions relative to the Ti and TiN layers by sputtering may be the same as those in [Step 3]. And patterning the second protective layer 27 can be performed by a process of RIE for example.

[Step 24]

Next, there are formed a wiring 32, a bit line 37 and contact plugs 34 and 36 in the same manner as in [Step 11] of Embodiment 1, hence producing the structure of FIG. 7C which is a typical partially sectional view thereof.

In Embodiment 2, the upper electrode layer and the the second protective layer are patterned in mutually different steps. As a result, the upper electrode 26 covers the ferroelectric thin film 23, the lower electrode 22 and the first protective layer 21 via the insulator layer 24, and further the second protective layer 27 covers the surface (including the side face) of the upper electrode 26, whereby it is rendered possible to prevent diffusion of hydrogen and intrusion of water content into the ferroelectric thin film with enhanced certainty.

(Embodiment 3)

Embodiment 3 relates to a method of forming the capacitor structure of the semiconductor memory element according to the third aspect of the present invention. More specifically, Embodiment 3 is different from Embodiment 1 in the procedure for forming a first protective layer, a lower electrode and a capacitor part.

Similarly to Embodiment 1, a ferroelectric thin film 23 is composed of a Y1-series material of $Bi_2SrTa_2O_9$, and each of a first protective layer and a second protective layer has a two-layer structure consisting of a Group IVa transition metal layer and a Group IVa transition metal nitride layer as in Embodiment 1. More specifically, each of the first and second protective layers has a two-layer structure consisting of a Ti layer and a TiN layer in this order from below. The semiconductor memory element consists of the aforementioned nonvolatile memory cell (known as FERAM). In the semiconductor memory element of Embodiment 3, one of source-drain regions and a lower electrode of a selective transistor are connected mutually via a contact plug, while an upper electrode is connected to a plate line. And a capacitor structure is formed above the selective transistor. That is, the above semiconductor memory element has a stacked element structure. Hereinafter Embodiment 3 will be described in detail with reference to FIGS. 8A–8E.

Figure 8A:
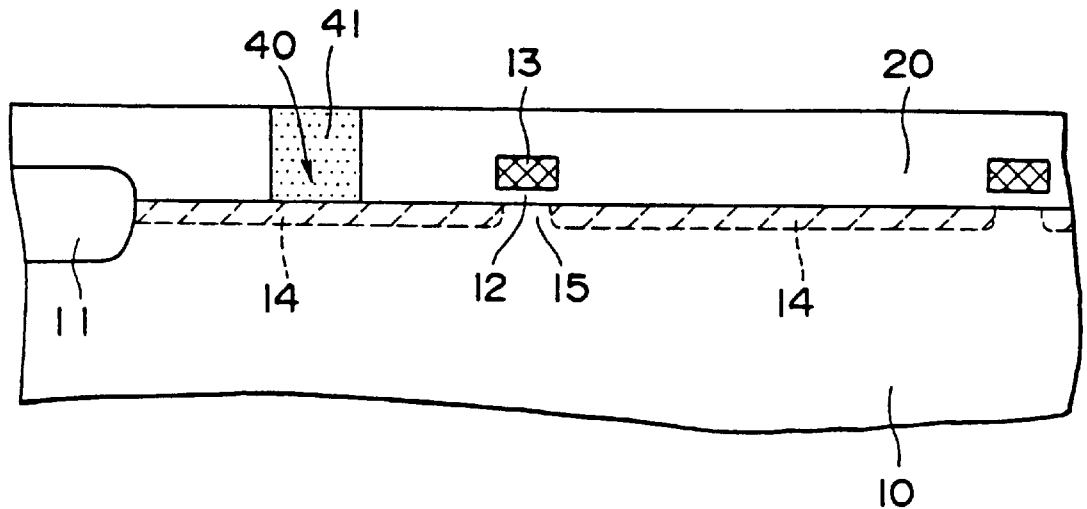
FIGS. 8A to 8E are sectional views of a memory cell for explaining steps in manufacture of a semiconductor memory in Embodiment 3.
Figure 8B:
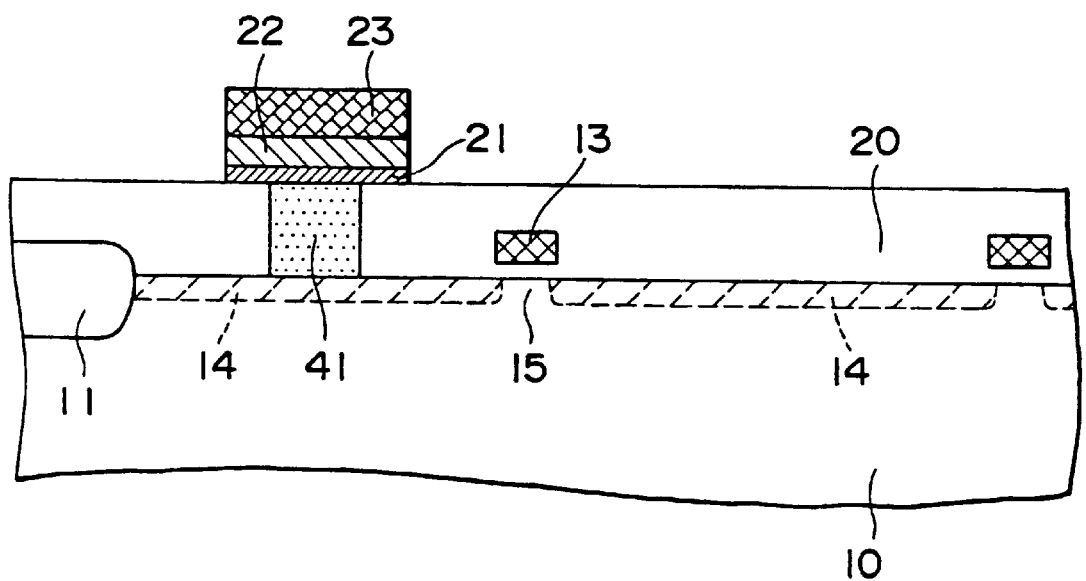
Figure 8C:
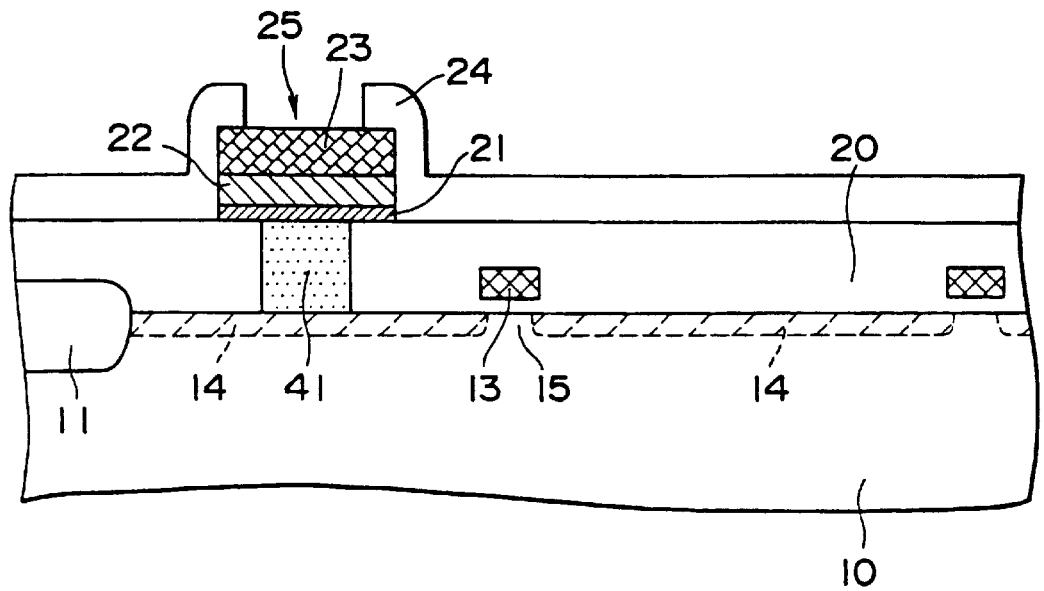
Figure 8D:
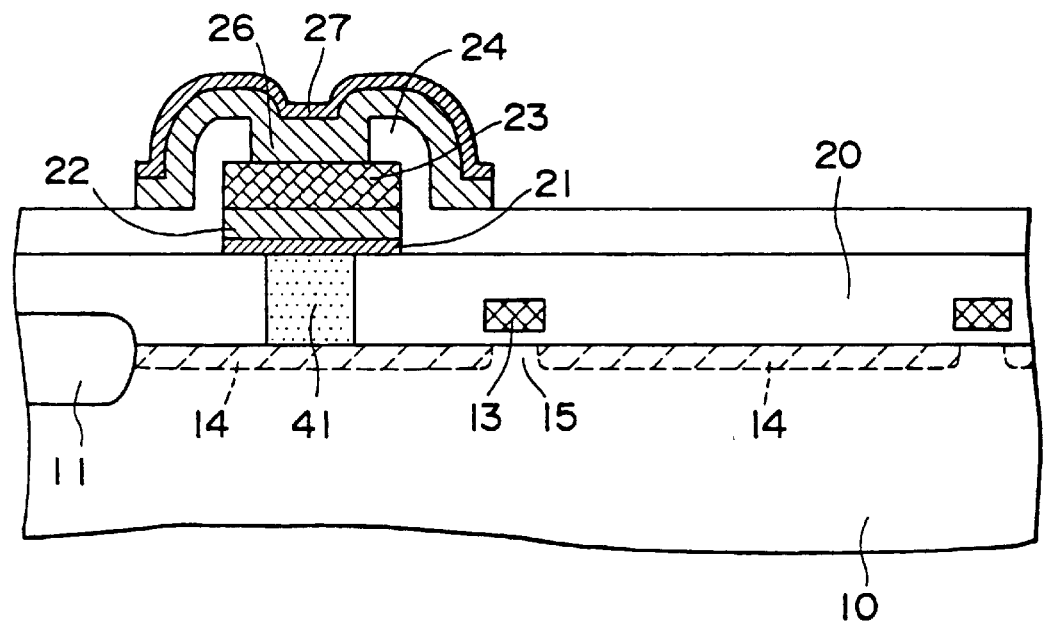
Figure 8E:
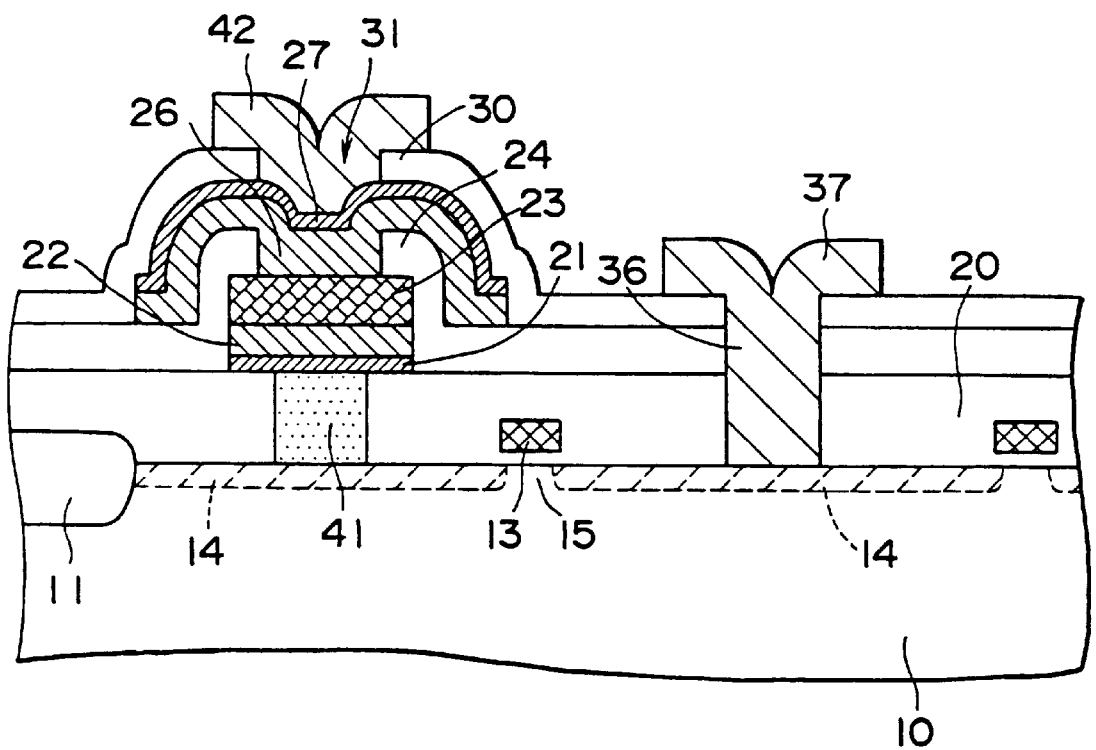

FIG. 8E is a typical partially sectional view of the semiconductor memory element in Embodiment 3. The structure of the selective transistor constituting the semiconductor memory element may be fundamentally the same as the structure of the selective transistor described in Embodiment 1.

A capacitor structure is formed on an intermediate insulator layer 20 over the selective transistor. This capacitor structure consists of a lower electrode 22 composed of platinum (Pt) for example, a ferroelectric thin film 23, and an upper electrode 26 composed of platinum (Pt) for example. The lower electrode 22 is formed on the intermediate insulator layer 20 corresponding to a substrate, and the ferroelectric thin film 23 is formed on the lower electrode 22. Further the upper electrode 26 is formed on the ferroelectric thin film 23.

A first protective layer 21 is formed between the intermediate insulator layer 20, which corresponds to a substrate, and the lower electrode 22. Meanwhile a second protective layer 27 is formed on the upper electrode 26. In Embodiment 3 also, each of the first protective layer 21 and the second protective layer 27 has a two-layer structure consisting of a layer of Group IVa transition metal (concretely Ti) and a layer of Group IVa transition metal nitride (concretely TiN). In this structure, the layer composed of Ti is a lower one, while the layer composed of TiN is an upper one. In this diagram, the first protective layer 21 and the second protective layer 27 are illustrated as a single layer. In Embodiment 3, the upper electrode 26 covers the ferroelectric thin film 23, the lower electrode 22 and the first protective layer 21 via an insulator layer 24 composed of $SiO_2$ for example.

An upper insulator layer 30 composed of BPSG for example is formed on the second protective layer 27. The upper electrode 26 is connected via the second protective layer 27 to a wiring 42 which corresponds to a plate line and extends in an opening 31 formed in the upper insulator layer 30. Further the lower electrode 22 is connected to one of the source-drain regions 14 (e.g., source region) of the selective transistor via a contact plug 41 provided in the first protective layer 21 and the intermediate insulator layer 20. Meanwhile the other of the source-drain regions 14 (e.g., drain region) of the selective transistor is connected to a bit line 37 via a contact plug 36 provided in the upper insulator layer 30 and the intermediate insulator layer 20.

[Step 31]

First, a selective transistor in the semiconductor memory element is produced in the same manner as in [Step 1] of Embodiment 1.

[Step 32]

Subsequently an intermediate insulator layer 20, which corresponds to a substrate and is composed of BPSG, is formed on the semiconductor substrate 10 by a process of CVD for example. It is preferred that the intermediate insulator layer 20 thus formed be caused to reflow for a time of, e.g., 20 minutes at 900° C. in an atmosphere of nitrogen gas. It is further preferred that, when necessary, the top surface of the intermediate insulator layer 20 be polished and flattened chemically and mechanically by a process of chemical mechanical polishing (CMP), or be flattened by a process of resist etch back. The film forming conditions relative to the intermediate insulator layer 20 may be the same as those in [Step 2] of Embodiment 1.

Thereafter an opening 40 is formed by a process of RIE in the intermediate insulator layer 20 above one of the source-drain regions 14 (e.g., source region). Then a polysilicon layer is deposited by a process of CVD on the intermediate insulator layer 20 inclusive of the opening 40, and the polysilicon layer on the intermediate insulator layer 20 is removed by a process of etch back. Subsequently an impurity such as phosphorus is implanted into the polysilicon layer to dope the same by ion implantation or the like, and a heat treatment is executed to activate the impurity, thereby producing a contact plug 41 where the opening 40 is filled with the doped polysilicon (FIG. 8A).

[Step 33]

Next a first protective layer 21 is formed on the intermediate insulator layer 20 corresponding to a substrate. The film forming conditions relative to the first protective layer 21 may be the same as those in [Step 3] of Embodiment 1.

[Step 34]

Subsequently a lower electrode layer is formed on the first protective layer 21 in the same manner as in [Step 4] of Embodiment 1.

[Step 35]

Next a ferroelectric thin film layer is formed on the lower electrode layer in the same manner as in [Step 6]of Embodiment 1.

[Step 36]

Thereafter the ferroelectric thin film layer, the lower electrode layer and the first protective layer are patterned by a process of RIE or the like to form a ferroelectric thin film 23 and a lower electrode 22 of platinum for example. Thus, the structure shown in FIG. 8B can be obtained.

[Step 37]

Then an insulator layer 24 composed of, e.g., $SiO_2$ is formed on the entire surface by a process of CVD for example, and thereafter an opening 25 is formed in the insulator layer 24 on the ferroelectric thin film 23 by a process of RIE (FIG. 8C).

[Step 38]

Subsequently, an upper electrode layer is formed on the insulator layer 24 inclusive of the opening 25. Forming the upper electrode layer of platinum (Pt) for example may be executed in the same manner as in [Step 4].

[Step 39]

Next, a second protective layer 27 having a two-layer structure is formed on the upper electrode layer. In Embodiment 3 also, the second protective layer 27 has a two-layer structure consisting of a Ti layer and TiN layer in this order from below. The film forming conditions relative to the Ti and TiN layers by sputtering may be the same as those in [Step 3].

[Step 40]

Thereafter an upper electrode 26 is formed by patterning the second protective layer 27 and the upper electrode layer by an art of ion milling for example (FIG. 8D). Thus, there is obtained a structure where the upper electrode 26 covers all of the ferroelectric thin film 23, the lower electrode 22 and the first protective layer 21 via the insulator layer 24. In Embodiment 3 also, the side wall of the upper electrode 26 is not covered with the second protective layer 27 since this layer 27 and the upper electrode layer are patterned simultaneously. However, even such a structure raises no problem in preventing diffusion of hydrogen or intrusion of water content into the capacitor part 23.

[Step 41]

Subsequently an upper insulator layer 30 composed of BPSG for example is formed on the entire surface. Forming the upper insulator layer 30 may be executed in the same manner as in [Step 2]. Thereafter an opening is formed in the upper insulator layer 30 above the second protective layer 27, and another opening is formed by a process of RIE in the upper insulator layer 30 and the intermediate insulator layer 20 above the other of source-drain regions 14 of the selective transistor. Next, in the same manner as in [Step 11] of Embodiment 1, a Ti layer and a TiN layer (not shown) are formed by sputtering in this order from below on the upper insulator layer 30 inclusive of the opening, and further a wiring material layer is formed thereon, whereby the opening is filled with aluminum alloy to consequently produce a contact plug 36. And finally the wiring material layer of aluminum alloy, the TiN layer and the Ti layer on the upper insulator layer are patterned to thereby form a wiring (plate line) 42 and a bit line 37 (FIG. 8E). Although the plate line in this example is formed by the use of an aluminum wiring, the plate line may be composed of platinum of the upper electrode as well.

(Embodiment 4)

Embodiment 4 relates to a method of forming the capacitor structure of the semiconductor memory element according to the fourth aspect of the present invention. More specifically, Embodiment 4 relates to a composite capacitor structure forming method which is a combination of the aforesaid procedure of forming a first protective layer, a lower electrode and a capacitor part described in Embodiment 3, and another aforesaid procedure of forming an upper electrode and a second protective layer described in Embodiment 2. The structure of the semiconductor memory element is planar type mentioned in Embodiment 1. Hereinafter a method of manufacturing the semiconductor memory element in Embodiment 4 will be described in detail with reference to FIGS. 9A–9D which are typical partially sectional views of a semiconductor substrate and so forth.

[Step 51]

First, a selective transistor in the semiconductor memory element is formed in the same manner as in [Step 1] of Embodiment 1.

[Step 52]

Next, as in [Step 2] of Embodiment 1, an intermediate insulator layer 20 corresponding to a substrate is formed on a semiconductor substrate 10 by a process of CVD for example.

[Step 53]

Thereafter, as in [Step 3] of Embodiment 1, a first protective layer 21 is formed on the intermediate insulator layer 20 corresponding to a substrate. The first protective layer 21 has a two-layer structure consisting of a Ti layer and a TiN layer in this order from below.

[Step 54]

Subsequently, as in [Step 4] of Embodiment 1, a lower electrode layer composed of platinum for example is formed on the first protective layer 21.

[Step 55]

Next, as in [Step 6] of Embodiment 1, a ferroelectric thin film layer is formed on the lower electrode layer.

[Step 56]

Thereafter the ferroelectric thin film layer, the lower electrode layer and the first protective layer are patterned by a process of RIE or the like to form a ferroelectric thin film 23 and a lower electrode 22 of platinum for this example. Thus, the structure shown in FIG. 9A can be produced.

[Step 57]

Then an insulator layer 24 composed of, e.g., $SiO_2$ is formed on the entire surface by a process of CVD for example, and an opening 25 is formed in the insulator layer 24 on the ferroelectric thin film 23 by a process of RIE.

[Step 58]

Figure 9A:
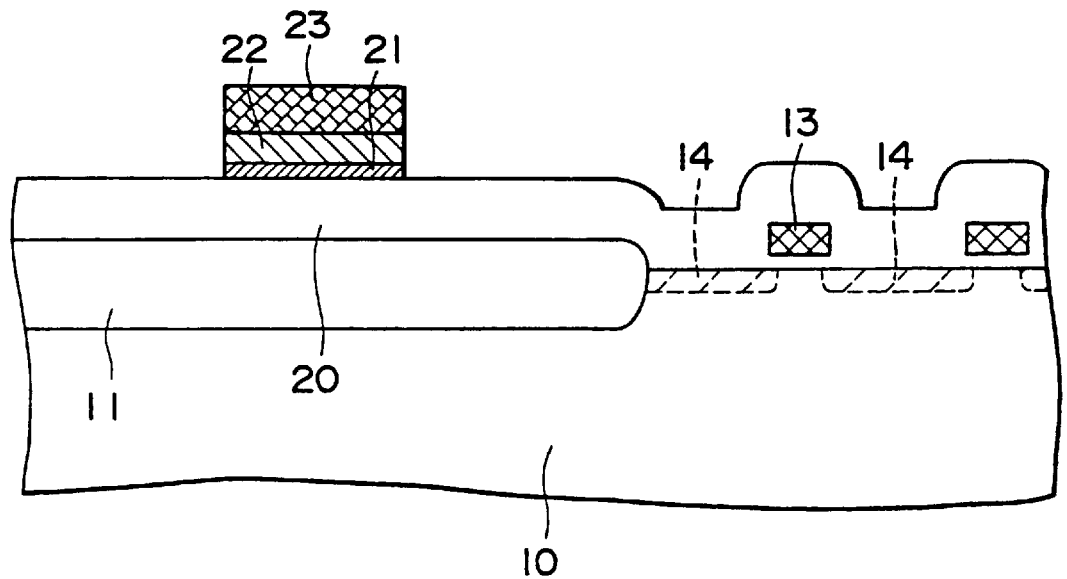
FIGS. 9A to 9D are sectional views of a memory cell for explaining steps in manufacture of a semiconductor memory in Embodiment 4.
Figure 9B:
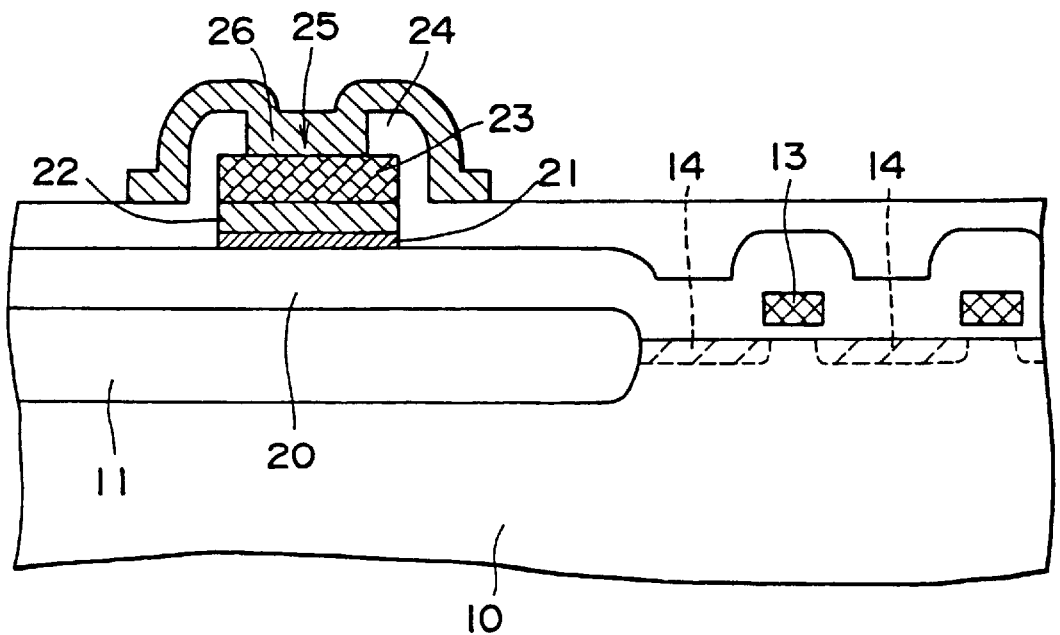

Next, an upper electrode layer is formed on the insulator layer 24 inclusive of the opening 25, and then an upper electrode 26 is formed by patterning the upper electrode layer (FIG. 9B). Forming the upper electrode layer of platinum for example may be executed in the same manner as in [Step 4]. Meanwhile, patterning the upper electrode layer may be performed by an art of ion milling for example.

[Step 59]

Figure 9C:
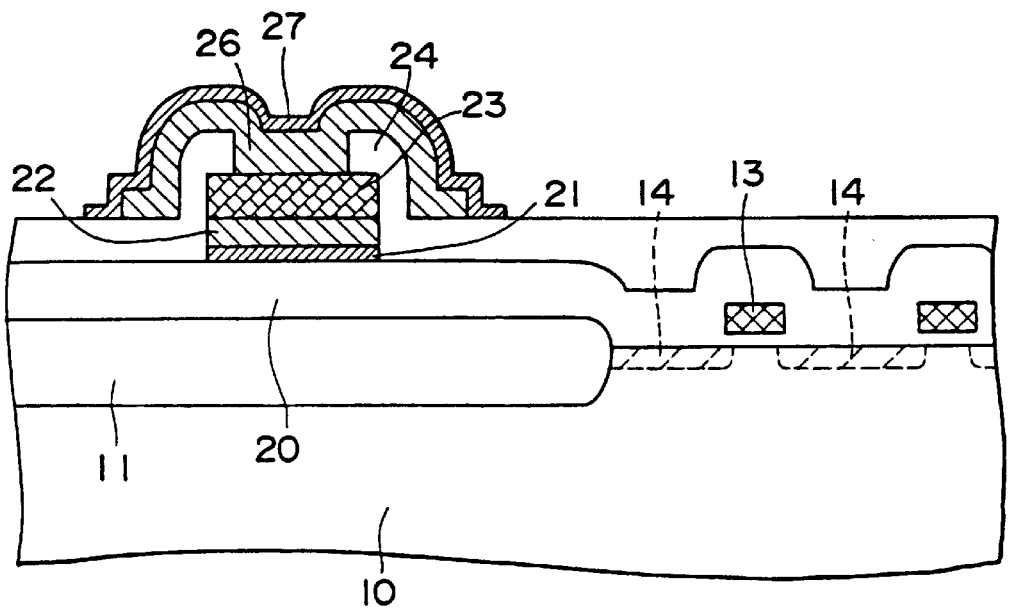

Subsequently a second protective layer 27, which has a two-layer structure consisting of a layer of Group IVa transition metal (Ti in Embodiment 4) and a layer of Group IVa transition metal nitride (TiN in Embodiment 2), is formed on the upper electrode 26, and the second protective layer 27 is so patterned as to cover the surface of the upper electrode 26 (FIG. 9C). Film forming conditions relative to the Ti and TiN layers by sputtering may be the same as those in [Step 3]. And patterning the second protective layer 27 may be performed by a process of RIE for example.

[Step 60]

Figure 9D:
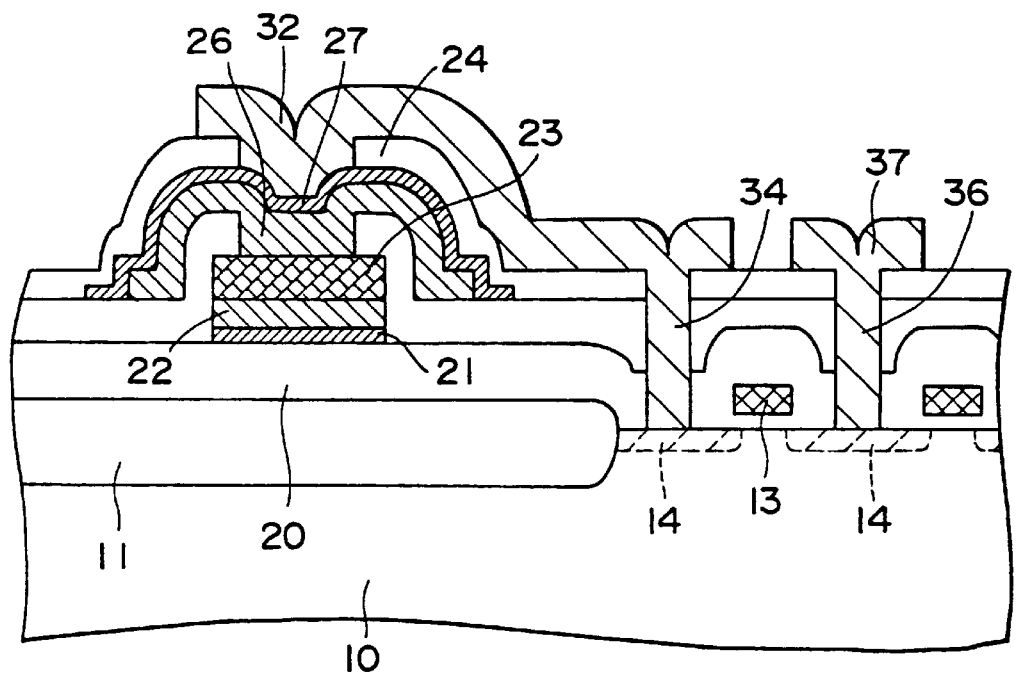

Then a wiring 32, a bit line 37 and contacts 34 and 36 are formed in the same manner as in [Step 11] of Embodiment 1, whereby there is produced the structure shown in a typical partially sectional view of FIG. 9D.

Although the present invention has been described hereinabove with reference to some embodiments thereof, it is to be understood that the present invention is not limited to such embodiments alone. The structure of the semiconductor memory element explained in connection with each of the embodiments is merely illustrative, and it may be changed or modified in design as well. For example, in the semiconductor memory element having the structure shown in FIG. 4, the first protective layer may be formed directly on the element isolating region in some cases. The method of forming the capacitor structure of the semiconductor memory element explained in Embodiments 1, 2 and 4 may be applied also to manufacture of a stacked semiconductor memory element explained in Embodiment 3. Similarly, the method of forming the capacitor structure of the semiconductor memory element explained in Embodiment 3 may be applied to manufacture of a planar semiconductor memory element as well.

In each of the above embodiments, a contact plug is produced by first fluidizing aluminum alloy and then filling an opening with such alloy, or by the use of polysilicon. However, it is also possible to product a contact plug by a process of blanket tungsten CVD as well. In this case, an opening is first formed in the intermediate insulator layer 20 and the upper insulator layer 30, and then a Ti layer and a TiN layer are formed by a process of sputtering in the same manner as in [Step 3]. And thereafter a tungsten layer is deposited on the TiN layer by a process of CVD under the following exemplary conditions.

| Gas used: | $WF_6/H_2/Ar$ = 40/400/2250 sccm |
|---|---|
| Pressure: | 10.7 kPa |
| Film forming temperature: | 450° C. |

Subsequently the tungsten layer and the TiN and Ti layers on the intermediate insulator layer 20 and the upper insulator layer 30 are removed by etching to consequently produce a desired contact plug where the opening is filled with tungsten. Thereafter a wiring layer composed of aluminum alloy is formed on the upper insulator layer 30 and then is patterned to thereby obtain lines 32, 42 and a bit line 37. Exemplary etching conditions are as follows.

First-stage etching: For tungsten layer

Gas used: $SF_6/Ar/He$=110:90:5 sccm

Pressure: 46 Pa

RF power: 275 W

Second-state etching: For TiN layer/Ti layer

Gas used: $Ar/Cl_2$=75/:5 sccm

Pressure: 6.5 Pa

RF power: 250 W

Thus, a variety of changes and modifications will be apparent to those skilled in the art without departing from the spirit of the invention.

The scope of the invention, therefore, is to be determined solely by the appended claims.

What is claimed is:

1. A method of manufacturing a capacitor in a nonvolatile memory cell, comprising the steps of:

forming an intermediate insulator layer on a semiconductor substrate:

forming, on the intermediate insulator layer, a first protective layer including first and second lower sub-layers wherein said first lower sub-layer is composed of a material selected from those of Group IVa transition metal, Group Va transition metal, nickel and palladium, and wherein said second lower sub-layer is composed of a material selected from those of Group IVa transition metal nitride, Group Va transition metal nitride and silicon nitride;

forming a lower electrode layer on said first protective layer;

forming a lower electrode by patterning said lower electrode layer and said first protective layer;

forming a ferroelectric thin film layer on said lower electrode, and patterning said ferroelectric thin film layer to thereby form a ferroelectric thin film;

forming an insulator layer over said ferroelectric thin film, said lower electrode and said first protective layer and connected to said intermediate insulator layer, wherein an upper opening is maintained in said insulator layer exposing a top surface of said ferroelectric thin film;

forming an upper electrode layer over both said top surface of said ferroelectric thin film and a top surface of said insulator layer, said upper electrode layer formed of a same material as said lower electrode layer;

forming a second protective layer over an entire upper surface of said upper electrode layer, said second protective layer including a first upper sub-layer composed of a material selected from those of Group IVa transition metal nitride, Group Va transition metal nitride and silicon nitride, and further including a second upper sub-layer composed of a material selected from those of Group IVa transition metal, Group Va transition metal, nickel and palladium;

forming an upper electrode by patterning said second protective layer and said upper electrode layer wherein outermost edges of said upper electrode terminate and connect with said intermediate insulator layer, and wherein said second protective layer terminates and connects with said outermost edges of said upper electrode or with said intermediate insulator layer; and forming an upper insulator layer over an entire upper surface of said second protective layer and connecting to said intermediate insulator layer, and then forming an opening in said upper insulator layer to expose a central area of said upper surface of said second protective layer.

2. A method of manufacturing a capacitor in a nonvolatile memory cell, comprising the steps of:

forming an intermediate insulator layer on a semiconductor substrate;

forming, on the intermediate insulator layer, a first protective layer including first and second lower sub-layers wherein said first lower sub-layer is composed of a material selected from those of Group IVa transition metal, Group Va transition metal, nickel and palladium, and wherein said second lower sub-layer is composed of a material selected from those of Group IVa transition metal nitride, Group Va transition metal nitride and silicon nitride;

forming a lower electrode layer on said first protective layer;

forming a lower electrode by patterning said lower electrode layer and said first protective layer;

forming a ferroelectric thin film layer on said lower electrode, and patterning said ferroelectric thin film layer to thereby form a ferroelectric thin film;

forming an insulator layer over said ferroelectric thin film said lower electrode and said first protective layer and connected to said intermediate insulator layer, wherein an upper opening is maintained in said insulator layer exposing a top surface of said ferroelectric thin film;

forming an upper electrode layer over both said top surface of said ferroelectric thin film and a top surface of said insulator layer, said upper electrode layer formed of a same material as said lower electrode layer, and then patterning said upper electrode layer to form an upper electrode wherein outermost edges of said upper electrode terminate and connect with said intermediate insulator layer;

forming a second protective layer over an entire upper surface of said upper electrode said second protective layer including a first upper sub-layer composed of a material selected from the group consisting of Group IVa transition metal nitride, Group Va transition metal nitride and silicon nitride, and further including a second upper sub-layer composed of a material selected from the Group consisting of Group IVa transition metal, Group Va transition metal, nickel and palladium, and then patterning said second protective layer wherein said second protective layer terminates and connects with said outermost edges of said upper electrode or with said intermediate insulator layer; and forming an upper insulator layer over an entire upper surface of said second protective layer and connecting to said intermediate insulator layer, and then forming an opening in said upper insulator layer to expose a central area of said upper surface of said second protective layer.

3. A method of manufacturing a capacitor in a nonvolatile memory cell, comprising the steps of:

forming an intermediate insulator layer on a semiconductor substrate, forming, on the intermediate insulator layer, a first protective layer including first and second lower sub-layers wherein said first lower sub-layer is composed of a material selected from those of Group IVa transition metal, Group Va transition metal, nickel and palladium, and wherein said second lower sub-layer is composed of a material selected from those of Group IVa transition metal nitride, Group Va transition metal nitride and silicon nitride;

forming a lower electrode layer on said first protective layer;

forming a ferroelectric thin film layer on said lower electrode layer;

patterning said ferroelectric thin film layer, said lower electrode layer and said first protective layer to thereby form a ferroelectric thin film and a lower electrode;

forming an insulator layer over said ferroelectric thin film, said lower electrode and said first protective layer and connected to said intermediate insulator layer, wherein an upper opening is maintained in said insulator layer exposing a top surface of said ferroelectric thin film;

forming an upper electrode layer over both said top surface of said ferroelectric thin film and a top surface of said insulator layer, said upper electrode layer formed of a same material as said lower electrode layer;

forming a second protective layer over an entire upper surface of said upper electrode, said second protective layer including a first upper sub-layer composed of a material selected from the group consisting of Group IVa transition metal nitride, Group Va transition metal nitride and silicon nitride, and further including a second upper sub-layer composed of a material selected from the group consisting of Group IVa transition metal, Group Va transition metal, nickel and palladium;

forming an upper electrode by patterning said second protective layer and said upper electrode layer wherein outermost edges of said upper electrode terminate and connect with said intermediate insulator layer, and wherein said second protective layer terminates and connects with said outermost edges of said upper electrode or with said intermediate insulator layer; and forming an upper insulator layer over an entire upper surface of said second protective layer and connecting to said intermediate insulator layer, and then forming an opening in said upper insulator layer to expose a central area of said upper surface of said second protective layer.

4. A method of manufacturing a capacitor in a nonvolatile memory cell, comprising the steps of:

forming an intermediate insulator layer on a semiconductor substrate;

forming, on the intermediate insulator layer, a first protective layer including first and second lower sub-layers wherein said first lower sub-layer is composed of a material selected from those of Group IVa transition metal, Group Va transition metal, nickel and palladium, and wherein said second lower sub-layer is composed of a material selected from those of Group IVa transition metal nitride; Group Va transition metal nitride and silicon nitride;

forming a lower electrode layer on said first protective layer;

forming a ferroelectric thin film layer on said lower electrode layer;

patterning said ferroelectric thin film layer, said lower electrode layer and said first protective layer to thereby form a ferroelectric thin film and a lower electrode;

forming an insulator layer over said ferroelectric thin film, said lower electrode and said first protective layer and connected to intermediate insulator layer, wherein an upper opening is maintained in said insulator layer exposing a top surface of said ferroelectric thin film;

forming an upper electrode layer over both said top surface of said ferroelectric thin film and a top surface of said insulator layer, said upper electrode layer formed of a same material as said lower electrode layer, and then patterning said upper electrode layer to form an upper electrode wherein outermost edges of said upper electrode terminate and connect with said intermediate insulator layer;

forming a second protective layer over an entire upper surface of said upper electrode, said second protective layer including a first upper sub-layer composed of a material selected from the group consisting of Group IVa transition metal nitride, Group Va transition metal nitride and silicon nitride, and further including a second upper sub-layer composed of a material selected from the group consisting of Group IVa transition metal, Group Va transition metal, nickel and palladium; and forming an upper insulator layer over an entire upper surface of said second protective layer and connecting to said intermediate insulator layer, and then forming an opening in said upper insulator layer to expose a central area of said upper surface of said second protective layer.

* * * * *